(12) United States Patent
Walker

(10) Patent No.: US 12,401,192 B2
(45) Date of Patent: Aug. 26, 2025

(54) ESD PROTECTION FOR INTEGRATED CIRCUIT DEVICES

(71) Applicant: SAMSUNG ELECTRONICS CO., LTD., Suwon-si (KR)

(72) Inventor: Darryl G. Walker, San Jose, CA (US)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 103 days.

(21) Appl. No.: 18/135,364

(22) Filed: Apr. 17, 2023

(65) Prior Publication Data
US 2023/0253784 A1    Aug. 10, 2023

Related U.S. Application Data

(63) Continuation of application No. 17/030,694, filed on Sep. 24, 2020, now Pat. No. 11,664,656.
(Continued)

(51) Int. Cl.
*H02H 9/04* (2006.01)
*H10D 89/60* (2025.01)

(52) U.S. Cl.
CPC ........... *H02H 9/046* (2013.01); *H10D 89/611* (2025.01); *H10D 89/713* (2025.01);
(Continued)

(58) Field of Classification Search
CPC ...... H01L 27/0248–0296; H02H 9/046; H10D 89/60–931
See application file for complete search history.

(56) References Cited

U.S. PATENT DOCUMENTS 5,760,444 A * 6/1998 Okumura ............ H01L 27/1203
257/350
6,535,368 B2    3/2003 Andresen
(Continued)

FOREIGN PATENT DOCUMENTS

CN      106024793 B     2/2019
WO      2018190881 A1   10/2018

OTHER PUBLICATIONS

U.S. Appl. No. 17/030,662, Final Office Action, dated Jun. 23, 2023.
(Continued)

*Primary Examiner* — Jared Fureman
*Assistant Examiner* — Christopher J Clark
(74) *Attorney, Agent, or Firm* — Sughrue Mion, PLLC

(57) ABSTRACT

An integrated circuit device having insulated gate field effect transistors (IGFETs) having a plurality of horizontally disposed channels that can be vertically aligned above a substrate with each channel being surrounded by a gate structure has been disclosed. The integrated circuit device may include electrostatic discharge (ESD) protection circuit structures. The ESD protection circuit structures may be formed in regions other than the region that the IGFETs are formed as well as in the region that the IGFETs having a plurality of horizontally disposed channels that can be vertically aligned above a substrate with each channel being surrounded by a gate structure are formed. By forming ESD protection circuit structures in regions below the IGFETs, an older process technology may be used and device size may be decreased. Furthermore, planar IGFETs of FinFETs may be formed in other regions to decrease device size and improve costs.

20 Claims, 12 Drawing Sheets

Related U.S. Application Data

(60) Provisional application No. 62/991,157, filed on Mar. 18, 2020.

(52) U.S. Cl.
CPC ......... *H10D 89/811* (2025.01); *H10D 89/911* (2025.01); *H10D 89/921* (2025.01); *H10D 89/931* (2025.01)

(56) References Cited

U.S. PATENT DOCUMENTS

| | | | |
|---|---|---|---|
| 9,219,005 | B2 | 12/2015 | Or-Bach et al. |
| 9,711,500 | B1 | 7/2017 | Walker |
| 9,871,034 | B1 | 1/2018 | Or-Bach |
| 10,290,626 | B1 | 5/2019 | Li |
| 10,354,995 | B2 | 7/2019 | Or-Bach et al. |
| 11,145,657 | B1 | 10/2021 | Or-Bach |
| 11,368,016 | B2 | 6/2022 | Walker |
| 11,594,618 | B2 | 2/2023 | Chen |
| 2004/0256675 | A1 | 12/2004 | McNeil |
| 2005/0247979 | A1 | 11/2005 | Fung |
| 2005/0286188 | A1* | 12/2005 | Camp ................ H01L 27/0262 361/56 |
| 2006/0082940 | A1* | 4/2006 | Lin ........................ H02H 9/046 361/91.1 |
| 2009/0278251 | A1 | 11/2009 | Tsai et al. |
| 2009/0289304 | A1 | 11/2009 | Pouydebasque |
| 2012/0162836 | A1 | 6/2012 | Furuta et al. |
| 2013/0294170 | A1 | 11/2013 | Sivero |
| 2016/0372920 | A1 | 12/2016 | Kinzer |
| 2017/0323882 | A1* | 11/2017 | Langguth ............ H01L 27/1207 |
| 2018/0138289 | A1 | 5/2018 | Rachmady |
| 2018/0212023 | A1 | 7/2018 | Weber |
| 2018/0219007 | A1 | 8/2018 | Shrivastava |
| 2018/0247929 | A1 | 8/2018 | Shrivastava |
| 2019/0074297 | A1 | 3/2019 | Kishishita |
| 2019/0165186 | A1 | 5/2019 | Shimbo |
| 2019/0229011 | A1* | 7/2019 | Suk .................. H01L 29/66439 |
| 2020/0168715 | A1 | 5/2020 | Wu |
| 2020/0295127 | A1 | 9/2020 | Mannebach |
| 2020/0312960 | A1 | 10/2020 | Bomberger |
| 2020/0343387 | A1 | 10/2020 | Liaw |
| 2020/0403007 | A1 | 12/2020 | Thomson |
| 2021/0225839 | A1 | 7/2021 | Lin |
| 2021/0296306 | A1 | 9/2021 | Walker |
| 2021/0296307 | A1 | 9/2021 | Walker |
| 2021/0296889 | A1 | 9/2021 | Walker |
| 2021/0305436 | A1 | 9/2021 | Kar |
| 2021/0366846 | A1 | 11/2021 | Hung |
| 2021/0384188 | A1 | 12/2021 | Kim |
| 2021/0391320 | A1 | 12/2021 | Wang |
| 2021/0408285 | A1 | 12/2021 | Hickey |
| 2022/0044104 | A1 | 2/2022 | Liu |
| 2022/0328411 | A1 | 10/2022 | Or-Bach |

OTHER PUBLICATIONS

U.S. Appl. No. 17/030,662, Advisory Action, dated Aug. 24, 2023.
U.S. Appl. No. 18/125,465, Non-Final Office Action, dated Aug. 1, 2023.
U.S. Appl. No. 18/125,465, Notice of Allowance, dated Aug. 28, 2023.
Office Action, dated Mar. 3, 2023, for U.S. Appl. No. 17/030,662, filed Sep. 24, 2023.
U.S. Appl. No. 62/991,157, filed Mar. 18, 2020, to which the present application claims priority.
U.S. Appl. No. 17/030,694, filed Sep. 24, 2020, to which the present application claims priority.

* cited by examiner

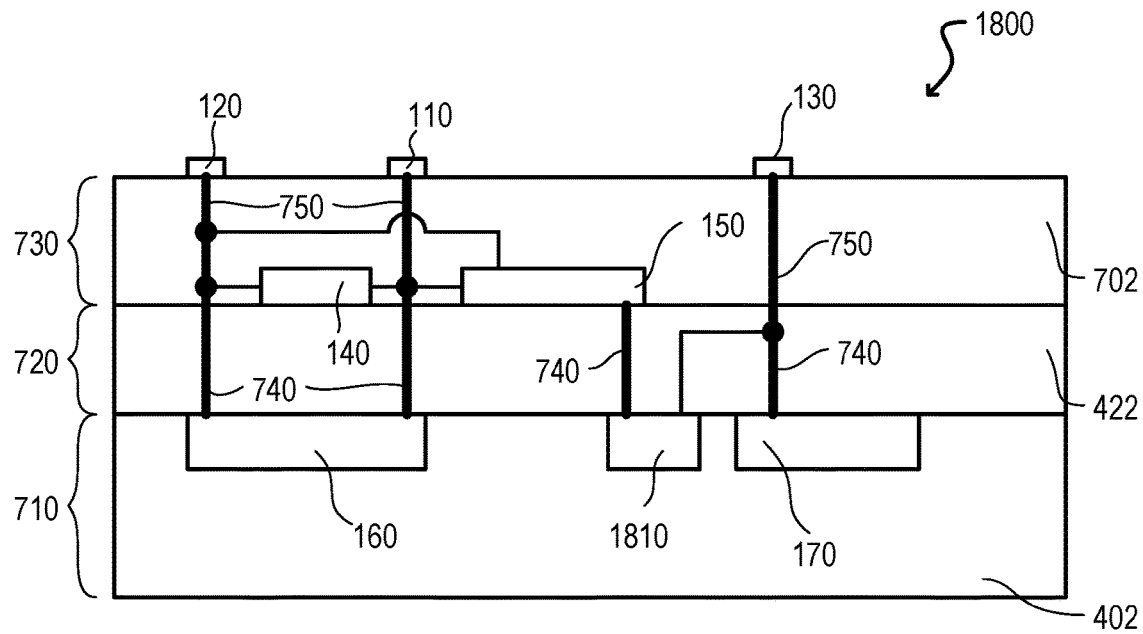
FIG. 18
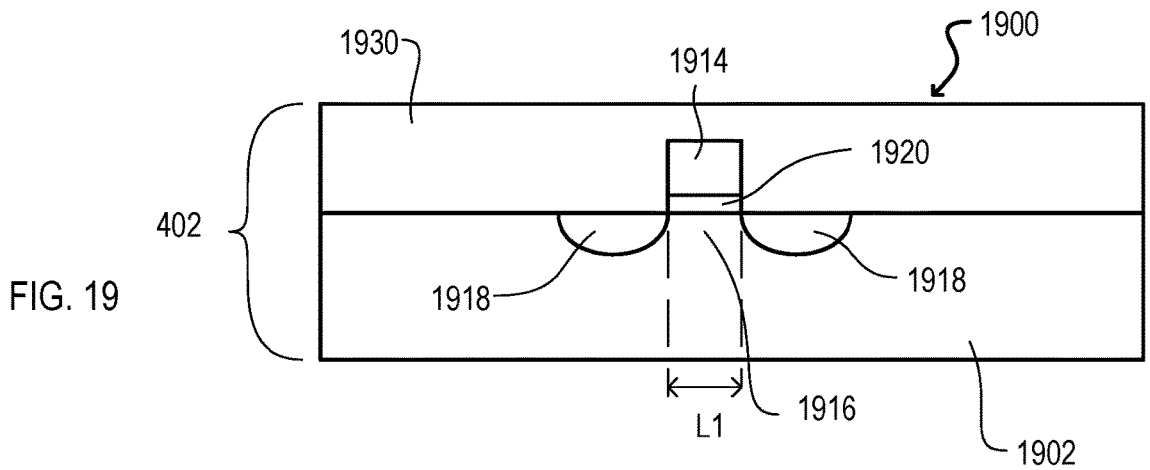
FIG. 19
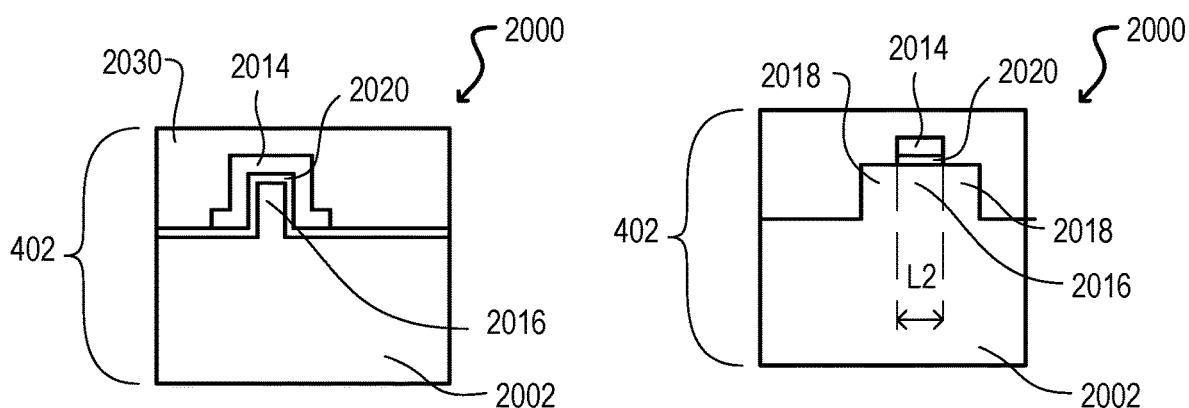
FIG. 20A
FIG. 20B

ESD PROTECTION FOR INTEGRATED CIRCUIT DEVICES

This application is a continuation of U.S. patent application Ser. No. 17/030,694 filed on Sep. 24, 2020, which claims the benefit of U.S. Provisional Patent Application Ser. No. 62/991,157, filed Mar. 18, 2020, the contents all of which are incorporated by reference herein.

TECHNICAL FIELD

The present invention relates generally to an integrated circuit (IC) device, and more particularly to improving electrostatic discharge (ESD) protection for an IC device.

BACKGROUND OF THE INVENTION

As transistor sizes get smaller, electrostatic discharge (ESD) can be more problematic due to smaller gate dielectric thicknesses and shorter transistor channels. Furthermore, ESD protection circuit structures may be incompatible with new technology and/or consume too much of the active footprint of an integrated circuit device.

In light of the above, it would be desirable to provide ESD protection circuit structures having current discharge capabilities being integrated with new device technology and having a smaller footprint effect on an integrated circuit device.

BRIEF DESCRIPTION OF THE DRAWINGS

FIG. 18 is a schematic diagram of an integrated circuit device according to an embodiment.

FIG. 19 is a cross-sectional schematic diagram of a planar IGFET that can be formed in a region according to an embodiment.

FIGS. 20A and 20B are cross-sectional schematic diagrams of a FinFET that can be formed in a region according to an embodiment.

DETAILED DESCRIPTION OF THE EMBODIMENTS

According to the embodiments set forth below, an input circuit, output circuit, and or input and output circuit including a transistor having a plurality of vertically stacked channels with improved gate control can be electrically connected to an external terminal and have an ESD (electrostatic discharge) circuit having at least portion of the ESD protection circuit structure formed in a layer/region below the input/output circuit. In this way, the footprint of the ESD structure as well as current leakage may be reduced and reliable ESD may be maintained.

Figure 1:
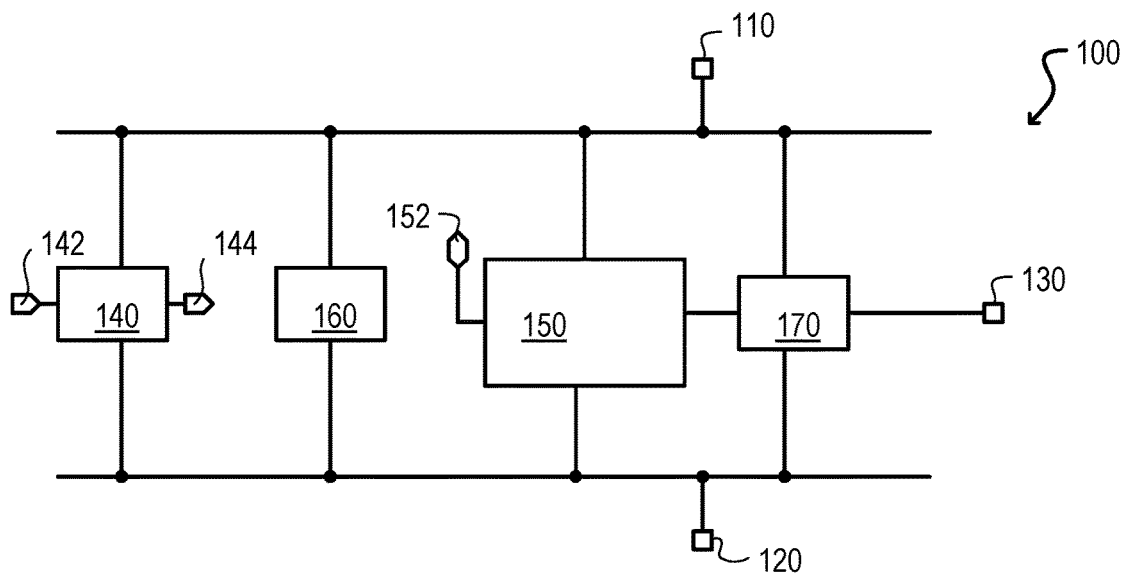
FIG. 1 is a circuit schematic diagram of an integrated circuit device including a circuit having an ESD protection circuit structure according to an embodiment.

Referring now to FIG. 1, an integrated circuit device including a circuit having an ESD protection circuit structure according to an embodiment is set forth in a schematic diagram and given the general reference character 100.

The circuit formed on integrated circuit device 100 can include pads (110, 120, and 130), internal circuit 140, interface circuit 150, and ESD protection circuit structures (160 and 170). Integrated circuit device 100 may be a semiconductor device.

Pad 110 may receive an externally provided supply potential (for example VDD). Pad 120 may receive an externally provided power supply potential (for example, VSS i.e. ground potential).

Pad 110 may be electrically connected to provide an externally provided supply potential (for example VDD) to internal circuit 140, interface circuit 150, and ESD protection circuit structures (160 and 170). Pad 120 may be electrically connected to provide an externally provided power supply potential (for example VSS) to internal circuit 140, interface circuit 150, and ESD structures (160 and 170). Pad 130 may provide and/or receive an external signal (for example, a data or control signal) to or from interface circuit 150 through ESD protection circuit structure 170. Interface circuit may receive or generate an internal signal at terminal 152. Interface circuit 150 may be a buffer circuit that buffers the external and internal signals generated or received.

Internal circuit 140 may receive at least one signal at an input terminal 142 and may provide at least one signal at an output terminal 144. In another example, internal circuit 140 may be an internal voltage regulating circuit that provides an internal power supply potential. The input terminal 142 and the output terminal 144 of internal circuit 140 are not electrically connected to any pad that can receive or provide a signal external to the integrated circuit device 100.

In one embodiment, internal circuit 140 may include insulated gate field effect transistors (IGFETs) having a plurality of horizontally disposed channels that can be vertically aligned above a substrate with each channel being surrounded by a gate structure. Interface circuit 150 may include insulated gate field effect transistors (IGFETs) having a plurality of horizontally disposed channels that can be vertically aligned above a substrate with each channel being surrounded by a gate structure. Both internal circuit 140 and interface circuit 150 may include p-type and n-type IGFETs. In one embodiment, ESD protection circuit structures (160 and 170) may include electrical components (such as diodes) formed with a plurality of horizontally disposed cathodes and anodes that can be vertically aligned above a substrate. In one embodiment, ESD protection circuit structures (160 and 170) may include electrical components (such as diodes, transistors, silicon controlled rectifiers (SCRs) and/or resistors) formed in the substrate. In one embodiment interface circuit 150 may include electrical components (such as IGFETs) formed in the substrate.

When ESD protection circuit structures (160 and 170) are formed in a semiconductor substrate of integrated circuit device 100, a process having larger critical dimensions (i.e. an older process and less expensive) may be used. The semiconductor substrate may then be sent to a state of the art fabrication facility to form the circuit including insulated gate field effect transistors (IGFETs) having a plurality of horizontally disposed channels that can be vertically aligned above a substrate with each channel being surrounded by a gate structure as will be discussed further in the specification.

Figure 2:
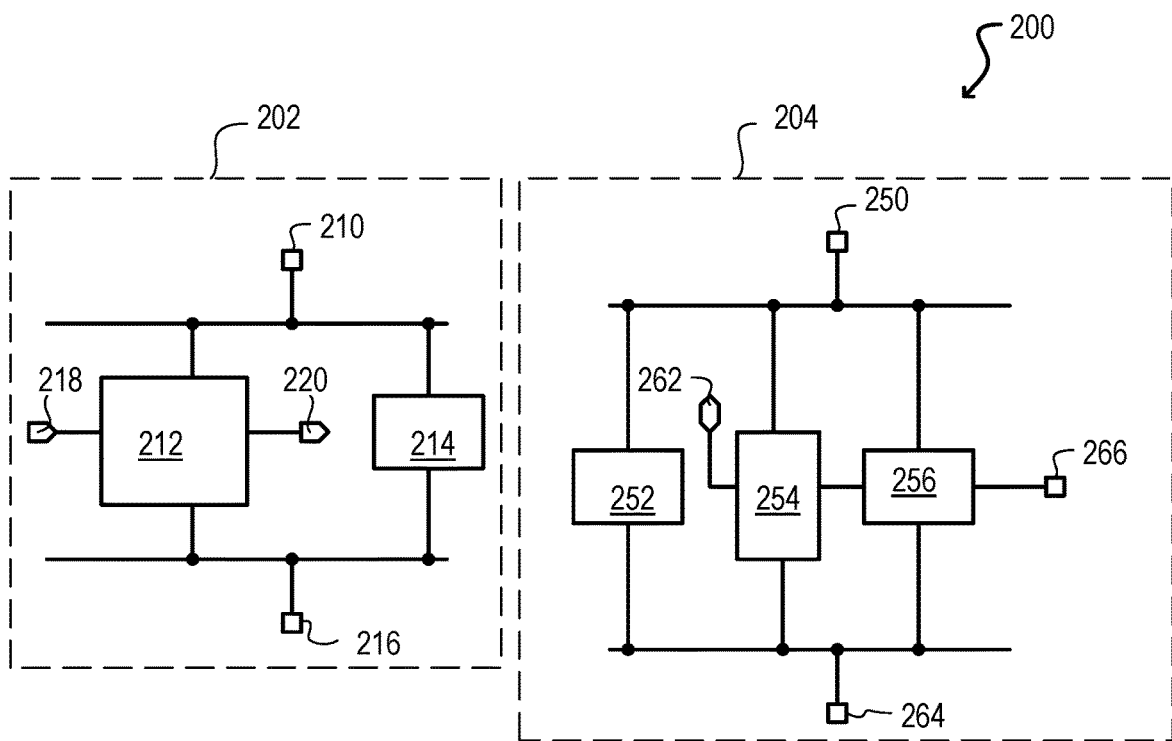
FIG. 2 is a circuit schematic diagram of an integrated circuit device including a circuit having an ESD protection circuit structure according to an embodiment.

Referring now to FIG. 2, an integrated circuit device including a circuit having an ESD protection circuit structure according to an embodiment is set forth in a circuit schematic diagram and given the general reference character 200. Integrated circuit device 200 may include a first circuit section 202 and a second circuit section 204. First circuit section 202 may include circuits that only have external connections to a power supply potential and/or a ground (VSS) potential. Second circuit section 204 may include circuits that have external connections to a power supply potential, a ground potential, and/or a pad coupled to provide or receive an external signal, such as a data signal, control signal or a clock signal, as just a few examples.

First circuit section 202 may include an internal circuit 212 and an ESD protection circuit structure 214. Internal circuit 212 and ESD structure 214 may each be electrically connected to pad (210 and 216). Internal circuit 212 may receive an input signal at an input terminal 218 and may provide an output signal at an output terminal 220. Pad 210 may receive an external power supply potential, such as VDD and pad 216 may receive an external reference potential such as VSS. In other embodiments, internal circuit 212 may be an internal power supply generator and may receive an external power supply potential at pad 210 and may provide an internal power supply potential to be used by internal circuits. The input terminal 218 and the output terminal 220 of internal circuit 212 are not electrically connected to any pad that can receive or provide a signal external to the integrated circuit device 200.

Second circuit section 204 may include pads (250, 264, and 266), an ESD protection circuit structure 252, an interface circuit 254, and ESD protection circuit structure 256. Interface circuit 254 may provide or receive an internal signal at terminal 262 and may provide and/or receive an external signal at pad 266 through ESD protection circuit structure 256. Interface circuit 254 may be electrically connected to pads (250 and 264). Pads (250 and 264) may respectively receive an external power supply potential (such as VDD) and a reference potential (such as VSS). ESD structure 252 may be electrically connected between pads (250 and 264). ESD structure 256 may be electrically connected to pads (250, 264, and 266).

In one embodiment, internal circuit 212 may include insulated gate field effect transistors (IGFETs) having a plurality of horizontally disposed channels that can be vertically aligned above a substrate with each channel being surrounded by a gate structure. Interface circuit 254 may include insulated gate field effect transistors (IGFETs) having a plurality of horizontally disposed channels that can be vertically aligned above a substrate with each channel being surrounded by a gate structure. Both internal circuit 212 and interface circuit 254 may include p-type and n-type IGFETs. In one embodiment, ESD protection circuit structures (214, 252, and 256) may include electrical components (such as diodes, transistors, and/or resistors) formed with a plurality of horizontally disposed cathodes and anodes that can be vertically aligned above a substrate. In one embodiment, ESD protection circuit structures (214, 252, and 256) may include electrical components (such as diodes, transistors, SCRs and/or resistors) formed in the substrate. In one embodiment interface circuit 254 may include electrical components (such as IGFETs) formed in the substrate.

When ESD protection circuit structures (214, 252, and 256) are formed in a semiconductor substrate of integrated circuit device 200, a process having larger critical dimensions (i.e. an older and cheaper process) may be used. The semiconductor substrate may then be sent to a state of the art fabrication facility to form the circuit including insulated gate field effect transistors (IGFETs) having a plurality of horizontally disposed channels that can be vertically aligned above a substrate with each channel being surrounded by a gate structure as will be discussed further in the instant specification.

Power supply potentials externally provided to pads (210 and 250) may be different power supply potentials, such as a first potential (VDD1) for internal circuit 212 and a second potential (VDD2) for interface circuit 254.

The IGFETs having a plurality of horizontally disposed channels that can be vertically aligned above a substrate with each channel being surrounded by a gate structure will now be discussed.

Figure 3A:
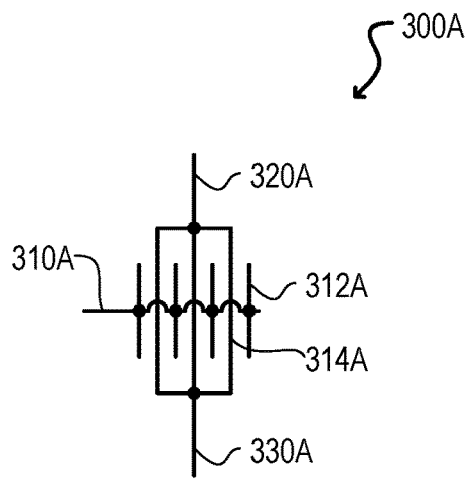
FIGS. 3A and 3B are circuit schematic diagrams of complementary IGFETs having a plurality of horizontally disposed channels that can be vertically aligned above a substrate with each channel being surrounded by a gate structure according to an embodiment.
Figure 3B:
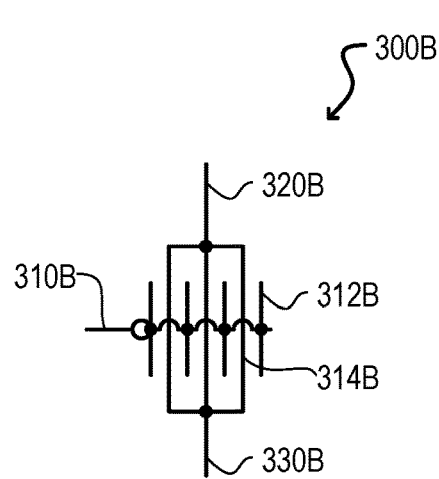

Referring now to FIGS. 3A and 3B, circuit schematic diagrams of complementary IGFETs having a plurality of horizontally disposed channels that can be vertically aligned above a substrate with each channel being surrounded by a gate structure according to an embodiment are set forth. FIG. 3A is a N-channel (N-type) IGFET 300A and FIG. 3B is a P-channel (P-type) IGFET 300B.

N-channel IGFET 300A includes a control gate terminal 310A, a first source/drain terminal 320A, and a second source/drain terminal 330A. Control gate terminal 310A may be electrically connected to control gate 312A. Control gate 312A may be drawn as a plurality of control gates on each side of a plurality of channel region 314A. In reality, control gate 312A may surround a plurality of horizontally disposed channel regions 314A that can be vertically aligned above a substrate.

P-channel IGFET 300B includes a control gate terminal 310B, a first source/drain terminal 320B, and a second source/drain terminal 330B. Control gate terminal 310B may be electrically connected to control gate 312B. Control gate 312B may be drawn as a plurality of control gates on each side of a plurality of channel region 314B. In reality, control gate 312B may surround a plurality of horizontally disposed channel regions 314B that can be vertically aligned above a substrate.

Figure 4:
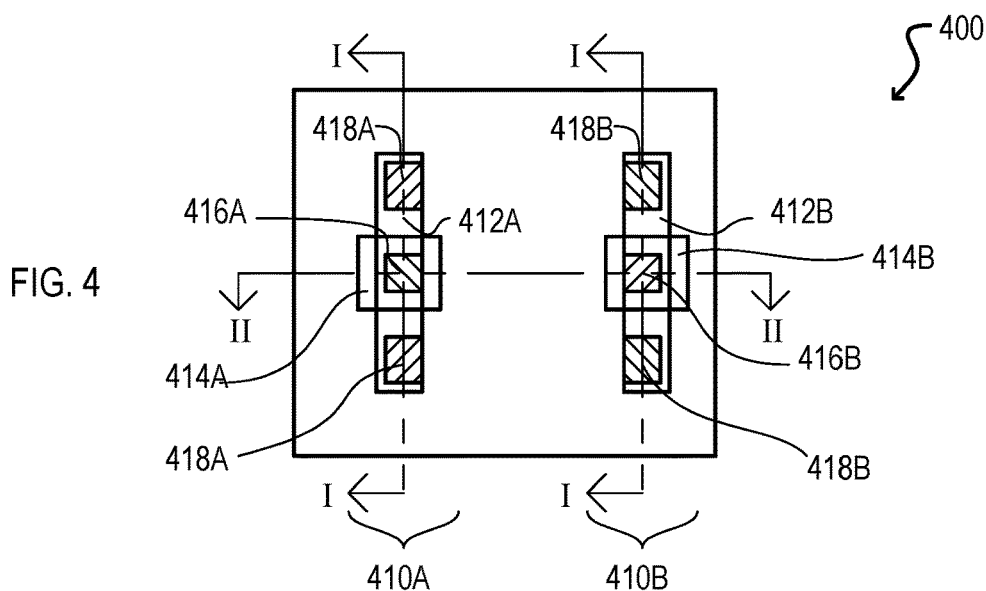
FIG. 4 is a top plan view of an integrated circuit device including n-type and p-type IGFETS according to an embodiment.

Referring now to FIG. 4, a top plan view of an integrated circuit device including n-type and p-type IGFETS according to an embodiment is set forth and given the general reference character 400.

Integrated circuit device 400 may include an N-type IGFET 410A and a P-type IGFET 410B.

N-type IGFET 410A and P-type IGFET 410B may each include a control gate that may surround a plurality of horizontally disposed channel regions that can be vertically aligned above a substrate.

N-type IGFET 410A may include drain/source contacts 418A, a gate contact 416A, a gate structure 414A, and vertically aligned and horizontally disposed channel region structures 412A.

P-type IGFET 410B may include drain/source contacts 418B, a gate contact 416B, a gate structure 414B, and vertically aligned and horizontally disposed channel region structures 412B.

Figure 5:
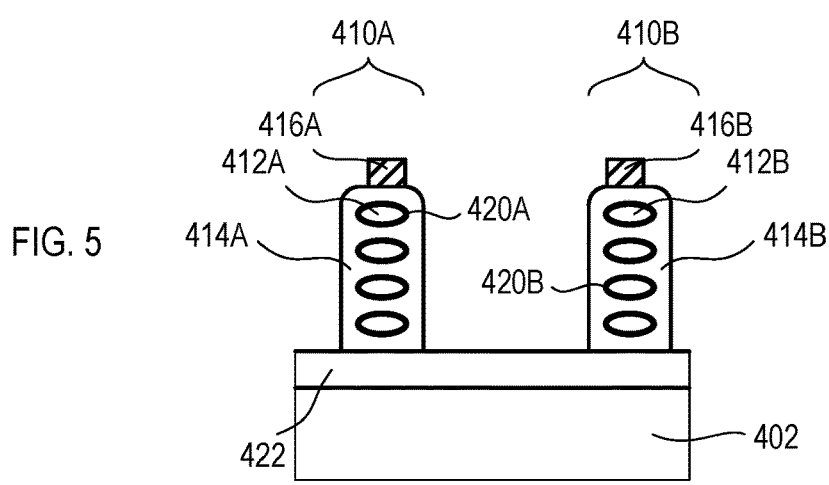
FIG. 5 is a cross sectional view of integrated circuit device according to an embodiment.

Referring now to FIG. 5, a cross sectional view of integrated circuit device 400 is set forth. The cross-sectional view is along the line II-II of FIG. 4.

Integrated circuit device 400 may include a substrate 402, an insulator layer 422 a N-type IGFET 410A, and a P-type IGFET 410B.

N-type IGFET 410A may include a gate contact 416A, a gate structure 414A, and vertically aligned and horizontally disposed channel regions 412A, and gate insulating layer 420A. Gate insulating layer 420A may surround each vertically aligned and horizontally disposed channel regions 412A.

P-type IGFET 410B may include a gate contact 416B, a gate structure 414B, and vertically aligned and horizontally disposed channel regions 412B, and gate insulating layer 420B. Gate insulating layer 420B may surround each vertically aligned and horizontally disposed channel regions 412B.

As will be discussed later, IGFETS including vertically aligned and horizontally disposed channel region structures may be used in internal circuits 140 of FIG. 1 or internal circuits 212 of FIG. 2 and/or interface circuit 150 of FIG. 1 and/or interface circuit 254 of FIG. 2, for example and ESD protection circuit structures (140, 160, 170, 214, 252, and/or 256) may include diodes, transistors, SCRs and/or resistors formed in substrate 402.

Figure 6:
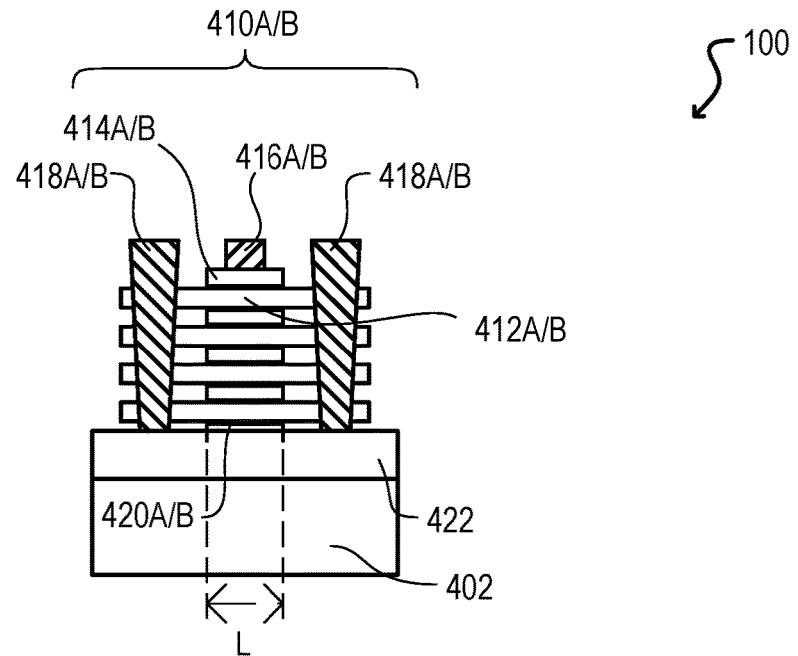
FIG. 6 is a cross sectional view of integrated circuit device according to an embodiment.

Referring now to FIG. 6, a cross sectional view of integrated device 400 is set forth. The cross-sectional view is along the line I-I of FIG. 4. As shown in FIG. 4, there are two lines I-I as the N-type IGFET 410A and P-type IGFET 410B may have similar structures except the materials and/or doping of materials may differ and elements are designated with the suffix "A/B" to illustrate such. Semiconductor device 400 may include a substrate 402, an insulator layer 422 and N-type and P-type IGFETs (410A/B). IGFET 410A/B may include a gate contact 416A/B, a gate structure 414A/B, vertically aligned and horizontally disposed channel regions 412A/B, gate insulating layer 420A/B, and drain/source contacts 418A/B. Gate structure 416A/B and gate insulating layer 420A/B may surround each vertically aligned and horizontally disposed channel regions 412A/B.

IGFETs (410A and 410B) may be formed by forming a layered crystal of two materials over dielectric region 422. For example, layers of silicon and silicon germanium may be formed. An etch and deposit step may then be used to form the source/drain regions (418A and 418B). The silicon layer may form the channel regions (412A and 412B). After a vertical etch, the silicon germanium layers may be etched by using a chemical that can selectively etch silicon germanium with the source/drain regions (418A and 418B) used as support structures. Next, the gate dielectric layers (420A and 420B) may be formed using atomic layer deposition, for example of hafnium-dioxide. Then gate structure (416A and 416B) may be formed using atomic layer deposition of a metal layer, for example, tungsten. The n-type IGFETs 410A may have source/drain regions 418A doped with n-type carriers, such as phosphorous and/or arsenic, for example. The p-type IGFETs 410B may have source/drain regions 418B doped with p-type carriers, such as boron, for example.

As will be discussed later, IGFETS including vertically aligned and horizontally disposed channel region structures may be used in internal circuits 140 of FIG. 1 or internal circuits 212 of FIG. 2 and/or interface circuits 150 of FIG. 1 and/or interface circuit 254 of FIG. 2, for example and ESD structures (140, 160, 170, 214, 252, and/or 256) may include diodes, transistors, and/or resistors formed in substrate 402.

Figure 7:
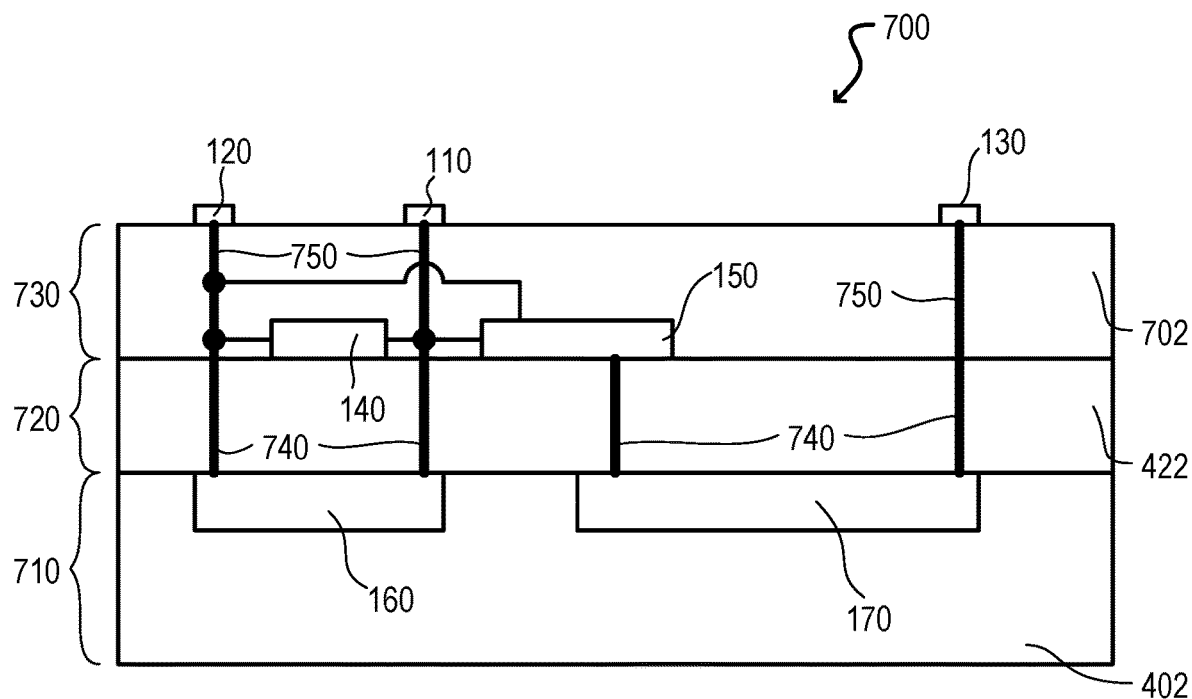
FIG. 7 is a schematic diagram of an integrated circuit device according to an embodiment.

Referring now to FIG. 7, a schematic diagram of an integrated circuit device according to an embodiment is set forth and given the general reference character 700.

Integrated circuit device 700 may include similar constituents as integrated circuit device 100 including IGFETs of integrated circuit device 400, such constituents may be given the same reference character. Integrated device 700 can include ESD protection circuit structures 160 and 170 formed in a substrate 402, an internal circuit 140, and an interface circuit 150.

Integrated circuit device 700 may include different regions. A region 710 may include ESD structures (160 and 170) formed in a semiconductor substrate 402. Another region 720 may include an insulator region 422 which may contain wirings 740. Wirings 740 may provide an interconnect between ESD structures (160 and 170) and interface circuit 150, internal circuit 140, and/or pads (110, 120, and 130). Wirings 740 may be in the form of vertical vias that are formed through insulator layer 422 and/or region 720. Another region 730 may include internal circuit 140 and interface circuit 150, as well as wirings 750, and pads (110, 120, and 130).

Pad 110 may receive an externally provided supply potential (for example VDD). Pad 120 may receive an externally provided power supply potential (for example VSS), and pad 130 may provide and/or receive an external signal (for example, a data or control signal).

ESD protection circuit structures (160 and 170) in region 710 may be formed using planar IGFETs, n-type and/or p-type diffusion regions, and silicon control rectifiers (SCR), for example. Region 720 may include passive elements, such as polysilicon and/or metal resistors, incorporated in ESD protection circuit structures (160 and 170).

Internal circuit 140 and interface circuit 150 in region 730 may include p-type and n-type IGFETs having a plurality of horizontally disposed channels that can be vertically aligned above substrate 402. Region 730 may generally have circuitry comprising p-type and n-type IGFETs having a plurality of horizontally disposed channels that can be vertically aligned above substrate 402. Region 710 may include planar IGFETs fabricated using older technologies with more relaxed critical dimensions. In this way, reliable ESD protection circuit structures can be made more cheaply. Another advantage is that the region 730 exclusively has the normal operating circuits (i.e. exclusive of ESD protection circuit structures which only operate when there is an ESD event). For example, if integrated circuit device 700 is a microprocessor, the central processing unit (CPU), bus, and memory would all be located in region 730 and manufactured with a cutting-edge state of the art process having smaller critical dimensions. By forming ESD structure (160 and 170) below the functional circuits, chip size can be reduced.

Figure 8:
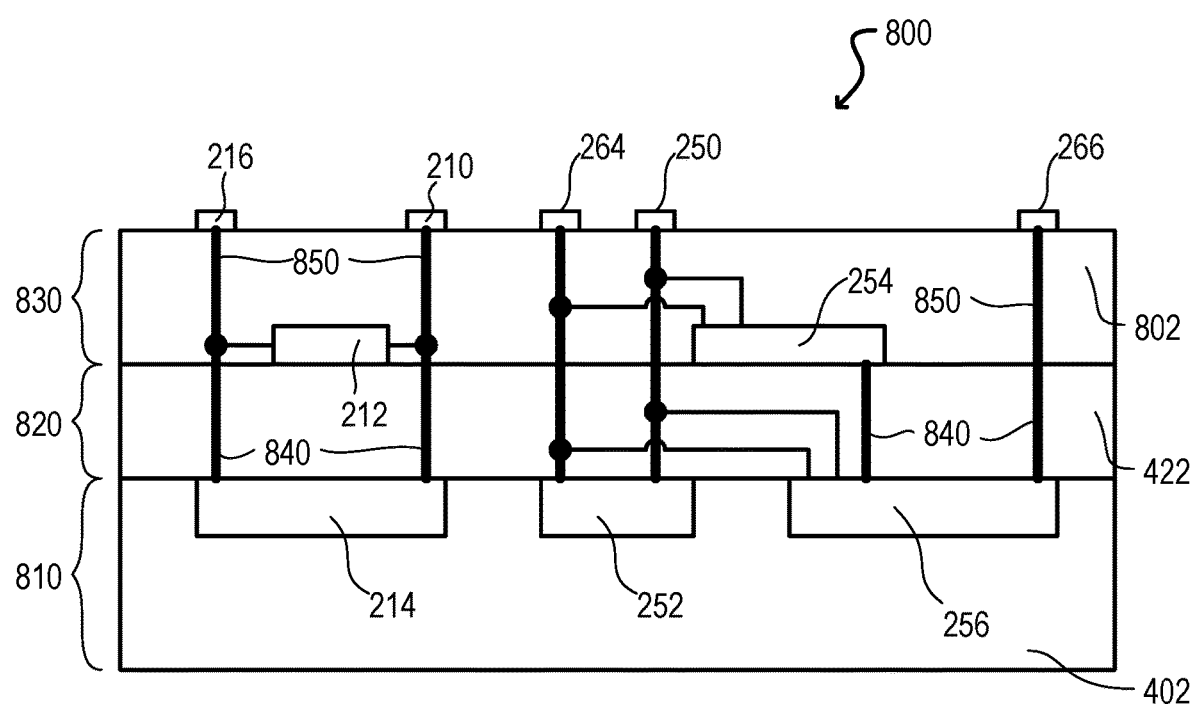
FIG. 8 is a schematic diagram of an integrated circuit device according to an embodiment.

Referring now to FIG. 8, a schematic diagram of an integrated circuit device according to an embodiment is set forth and given the general reference character 800.

Integrated circuit device 800 may include similar constituents as semiconductor device 200 including IGFETs of integrated circuit device 400, such constituents may be given the same reference character. Integrated circuit device 800 can include ESD protection circuit structures (214, 252, and 256) formed in a substrate 402, an internal circuit 212, and an interface circuit 254.

Integrated circuit device 800 may include different regions. A region 810 may include ESD protection circuit structures (214, 252, and 256) formed in a semiconductor substrate 402. Another region 820 may include an insulator region 422 which may contain wirings 840. Wirings 840 may provide an interconnect between ESD protection circuit structures (214, 252, and 256) and interface circuit 254, internal circuit 212, and/or pads (210, 216, 250, 264, and 266). Wirings 840 may be in the form of vertical vias that are formed through insulator layer 422 and/or region 820. Another region 830 may include internal circuit 212 and interface circuit 254, as well as wirings 850, and pads (210, 216, 250, 264, and 266).

Internal circuit 212 and ESD protection circuit structure 214 may each be electrically connected to pad (210 and 216). Internal circuit 212 may receive an input signal at an input terminal 218 and may provide an output signal at an output terminal 220. Pad 210 may receive an external power supply potential, such as VDD and pad 216 may receive an external reference potential such as VSS. In other embodiments, internal circuit 212 may be an internal power supply generator and may receive an external power supply potential at pad 216 and may provide an internal power supply potential to be used by internal circuits.

Pad 250 may receive an externally provided supply potential (for example VDD). Pad 264 may receive an externally provided power supply potential (for example VSS), and pad 266 may provide and/or receive an external signal (for example, a data or control signal).

ESD protection circuit structures (214, 252, and 256) in region 810 may be formed using planar IGFETs, n-type and/or p-type diffusion regions, and silicon control rectifiers (SCR), for example. Region 820 may include passive elements, such as polysilicon and/or metal resistors, incorporated in ESD structures (214, 252, and 256).

Internal circuit 212 and interface circuit 254 in region 830 may include p-type and n-type IGFETs having a plurality of horizontally disposed channels that can be vertically aligned above substrate 402. Region 830 may generally have circuitry comprising p-type and n-type IGFETs having a plurality of horizontally disposed channels that can be vertically aligned above substrate 402. Region 810 may include planar IGFETs or FinFETs fabricated using older technologies with more relaxed critical dimensions. In this way, reliable ESD protection circuit structures can be made more cheaply. Another advantage is that the region 830 exclusively has the normal operating circuits (i.e. exclusive of ESD structures which only operate when there is an ESD event). For example, if semiconductor device 800 is a microprocessor, the central processing unit (CPU), bus, and memory would all be located in region 830 and manufactured with a cutting edge state of the art process having smaller critical dimensions. By forming ESD protection circuit structures (214, 252, and 256) below the functional circuits, chip size can be reduced.

Figure 9:
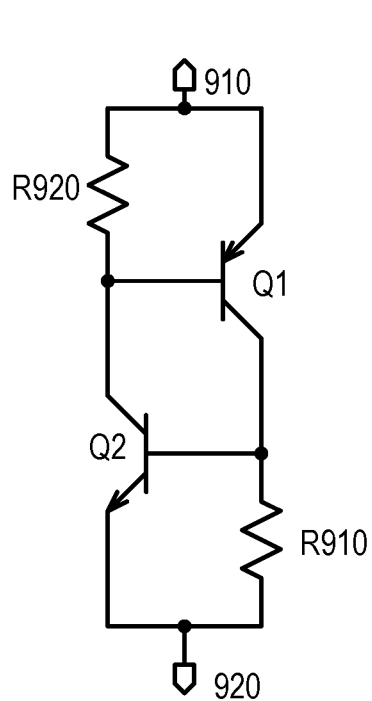
FIG. 9 is a circuit schematic diagram of an ESD protection circuit structure according to an embodiment.
Figure 10:
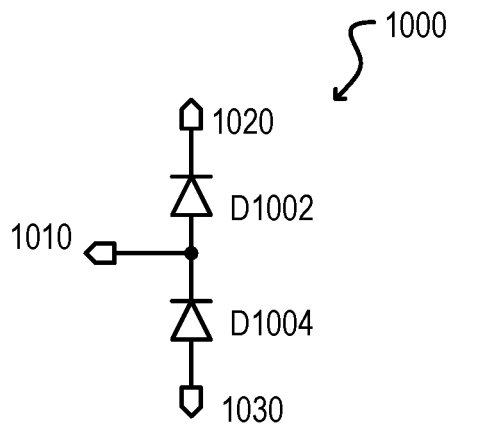
FIG. 10 is a circuit schematic diagram of an ESD protection circuit structure according to an embodiment.
Figure 11:
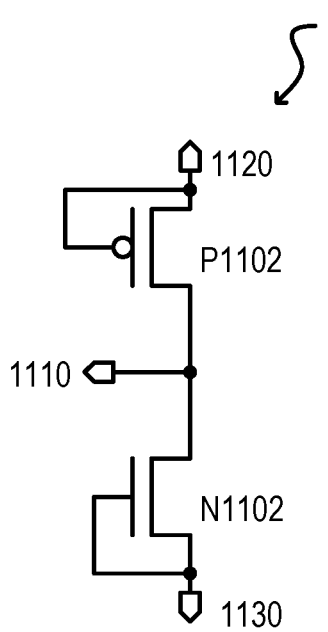
FIG. 11 is a circuit schematic diagram of an ESD protection circuit structure according to an embodiment.

FIGS. 9 to 11 illustrate various ESD protection circuit structures that may be formed in regions (710 and 810) of FIGS. 7 and 8.

Referring now to FIG. 9, a circuit schematic diagram of an ESD protection circuit structure according to an embodiment is set forth and given the general reference character 900. ESD structure 900 may be a silicon controlled rectifier (SCR).

ESD structure 900 may include bipolar transistors (Q1 and Q2) and resistors (R910 and R920). Bipolar transistor Q1 may have an emitter terminal connected to a terminal 910, a base terminal commonly connected to a first terminal of resistor R920 and a collector terminal of bipolar transistor Q2, and a collector terminal commonly connected to a base terminal of bipolar transistor Q2 and a first terminal of resistor R910. Bipolar transistor Q2 may have an emitter terminal connected to a terminal 920. Resistor R910 may have a second terminal connected to terminal 920. Resistor R920 may have a second terminal connected to terminal 910.

ESD structure 900 may be used as ESD protection circuit structures (160, 170, 214, 252, and/or 256). When used as ESD protection circuit structure (140, 214, or 252) terminal 910 may be electrically connected to pads (110, 210, or 250) respectively, and terminal 920 may be electrically connected to pads (120, 216, or 264) respectively. When ESD protection circuit structure 900 is used as ESD protection circuit structure (170 or 256), terminal 910 may be connected to pads (130 or 266) respectively and terminal 920 may be electrically connected to pads (120 or 264) respectively.

Referring now to FIG. 10, a circuit schematic diagram of an ESD protection circuit structure according to an embodiment is set forth and given the general reference character 1000.

ESD protection circuit structure 1000 can include diodes (D1002 and D1004). Diode D1002 may have a cathode terminal connected to terminal 1020 and an anode terminal connected to terminal 1010. Diode D1004 may have a cathode terminal connected to terminal 1010 and an anode terminal connected to terminal 1030.

ESD protection circuit structure 1000 may be used as ESD protection circuit structures (170 and 256). When used as ESD protection circuit structures (170 or 256), terminal 1020 may be electrically connected to pads (110 or 250), respectively, terminal 1010 may be electrically connected to pads (130 or 266), respectively, and terminal 1030 may be electrically connected to pads (120 or 264), respectively.

Referring now to FIG. 11, a circuit schematic diagram of an ESD protection circuit structure according to an embodiment is set forth and given the general reference character 1100.

ESD structure 1100 can include IGFETs (P1102 and N1102). IGFET P1102 may have a source terminal and gate terminal commonly electrically connected to terminal 1120 and drain terminal electrically connected to terminal 1110. IGFET N1102 may have a source terminal and gate terminal commonly electrically connected to terminal 1130 and drain terminal electrically connected to terminal 1110. IGFET P1102 may be a p-type IGFET and IGFET N1102 may be a n-type IGFET.

ESD structure 1100 may be used as ESD protection circuit structures (170 and 256). When used as ESD protection circuit structures (170 or 256), terminal 1120 may be electrically connected to pads (110 or 250), respectively, terminal 1110 may be electrically connected to pads (130 or 266), respectively, and terminal 1130 may be electrically connected to pads (120 or 264), respectively.

Figure 12:
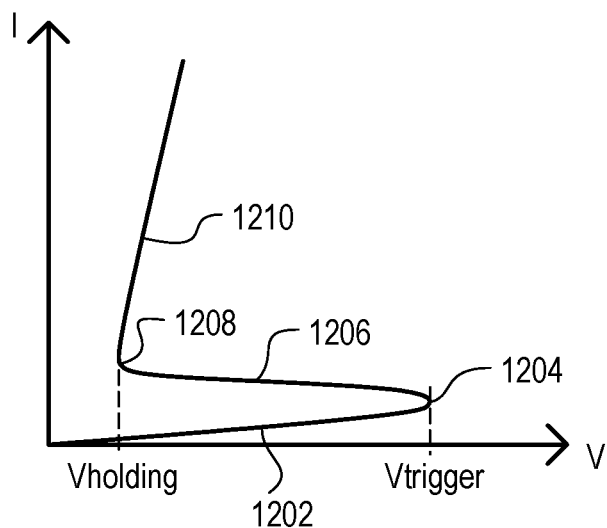
FIG. 12 is a current-voltage diagram of an ESD protection circuit structure according to an embodiment.

Referring now to FIG. 12, a current-voltage diagram of an ESD protection circuit structure is set forth.

FIG. 12 is a current-voltage diagram of a typical ESD protection circuit structure. For example, FIG. 12 may be a current-voltage (I-V) diagram of SCR 900 of FIG. 9.

For example, the current voltage diagram of FIG. 12 shows the SCR 900 in a forward blocking region 1202 in which there is minimal leakage current, which occurs when there is no ESD event. Once an ESD event occurs and the voltage spikes above a trigger voltage Vtrigger shown at point 1204 in the I-V diagram of FIG. 12, the SCR 900 snaps back through snap back region 1206 toward a minimum holding voltage Vholding at point 1208. Then in the holding region 1210, the SCR functions as a near ideal switch, the slope in holding region 1210 represents the on resistance of the SCR 1200. This slope is proportional to the size of the SCR 1200, thus a larger SCR 1200 dissipates more current at a lower holding voltage in the holding region. In designing the ESD protection circuit structures it is important to place the trigger voltage Vtrigger at a voltage that will be low enough that the IGFETs formed with vertically aligned and horizontally disposed channel regions in regions (730 and 830) will not breakdown during an ESD event.

Figure 13:
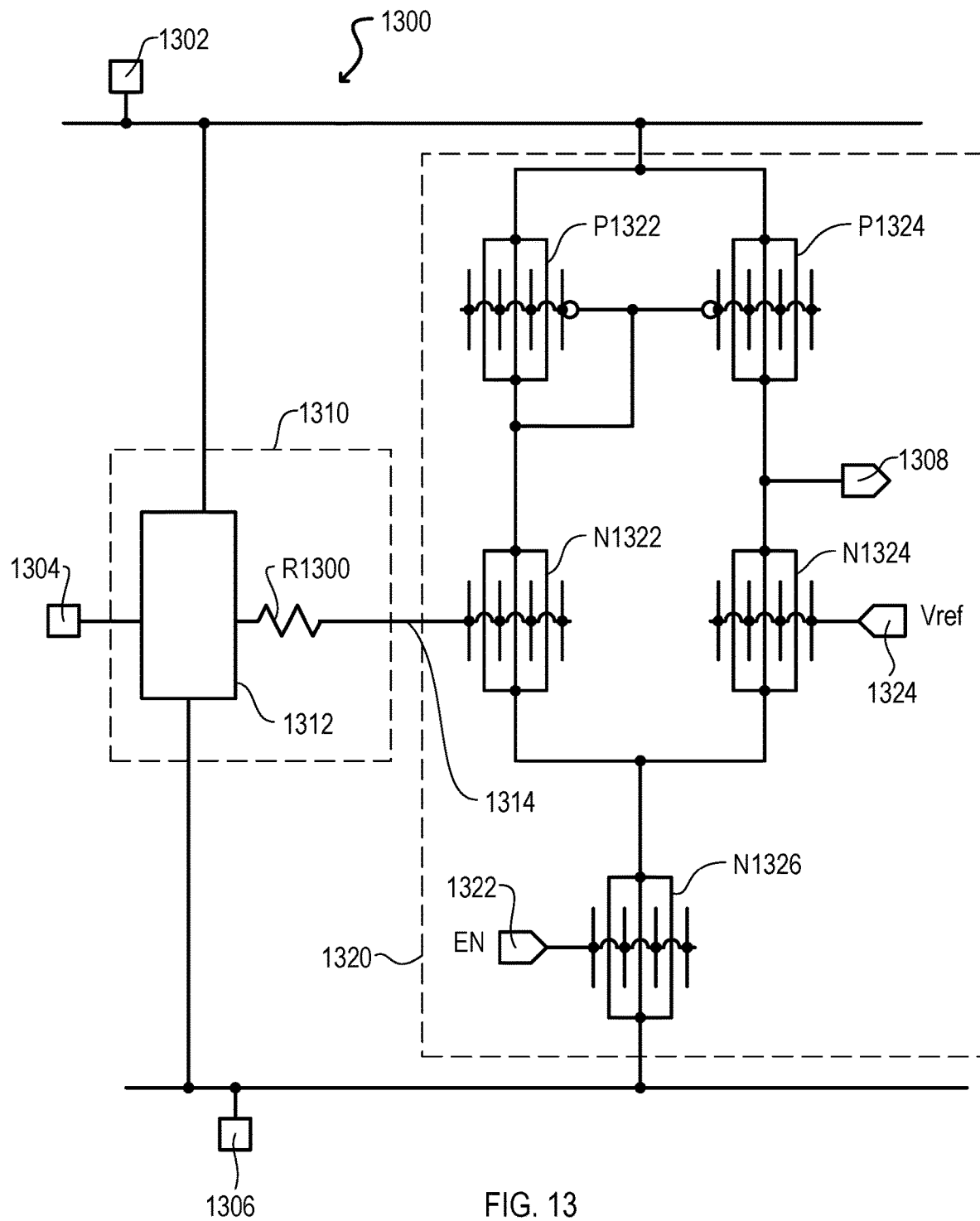
FIG. 13 is a circuit schematic diagram of an integrated circuit device according to an embodiment.

Referring now to FIG. 13, a circuit schematic diagram of an integrated circuit device according to an embodiment is set forth and given the general reference character 1300.

Integrated circuit device 1300 can include an ESD protection circuit structure 1310 and an input buffer circuit 1320. ESD protection circuit structure 1310 can be electrically connected to receive an input signal at a pad 1304. The input signal may pass through the ESD protection circuit structure 1310 to terminal 1314.

Input buffer circuit 1320 may receive the input signal from terminal 1314 and may provide an output signal at terminal 1308 (terminal 1308 may be an output terminal). Input buffer circuit 1320 may receive an enable signal EN at terminal 1322 and a reference potential Vref at terminal 1324.

ESD circuit structure 1310 can include an ESD protection circuit structure 1312 and a resistor R1300. ESD protection circuit structure 1312 may be electrically connected to pads (1302, 1304, and 1306). Pad 1302 may receive an externally provided power supply potential, such as VDD. Pad 1306 receive an externally provided power supply potential, such as VSS. Pad 1304 may receive an input signal, such as an address, data, and/or control signal, as just a few examples. ESD protection circuit structure 1312 may be electrically connected to a first terminal of resistor R1300. Resistor R1300 may be electrically connected to terminal 1314.

ESD structure 1312 may be an ESD protection circuit structure (900, 1000, or 1100), as just a few examples. In the case of ESD structure (900, 1000, or 1100), pad 1304 may be electrically connected to terminal (910, 1010, or 1110), respectively.

Input buffer circuit 1320 may include IGFETs (P1322, P1324, N1322, N1324, and N1326). IGFET P1322 may have a source terminal electrically connected to pad 1302 and commonly coupled to a source terminal of IGFET P1324. IGFET P1322 may have a gate terminal and a drain terminal commonly connected to a gate terminal of IGFET P1324 and a drain terminal of IGFET N1322. IGFET P1324 may have a drain terminal connected to terminal 1308. IGFET N1322 may have a gate terminal coupled to receive a signal at terminal 1314 through ESD circuit structure 1310. IGFET N1322 may have a source terminal commonly connected to a source terminal of IGFET N1324 and a drain terminal of IGFET N1326. IGFET N1324 may have a drain terminal connected to terminal 1308 and a gate terminal connected to receive a reference potential Vref at terminal 1324. IGFET N1326 may have a gate terminal connected to receive an enable signal EN at terminal 1322 and a source terminal connected to pad 1306. Input buffer circuit 1320 may operate as a differential input buffer that is enabled when enable signal EN is at a logic high level and disabled when enable signal EN is at a logic low level.

IGFETs (P1322, P1324, N1322, N1324, and N1326) may each include a control gate that may surround a plurality of horizontally disposed channel regions that can be vertically aligned above a substrate as set forth in FIGS. 3A, 3B, 4, 5, and 6 and may be formed in region (702 or 802) as set forth in FIGS. 7 and 8, respectively. ESD structure 1312 may be formed in regions 402 in FIGS. 7 and 8, for example. Resistor R1300 may be formed in region (402 and/or 422) in FIGS. 7 and 8, for example. Resistor R1300 may even be formed in region (702 or 802) as set forth in FIGS. 7 and 8, respectively. Resistor R1300 may be formed, for example, as a diffusion layer in region 402, a metal layer in region 422, and/or a metal layer in region (702 or 802) as set forth in FIGS. 7 and 8, respectively.

Reference potential Vref may provide a threshold voltage for determining the logic level of an input signal received at pad 1304. For example, if the potential of the input signal received at pad 1304 is greater than reference potential Vref, input buffer circuit 1320 may provide a logic high output at output terminal 1308. However, if the potential of the input signal received at pad 1304 is less than reference potential Vref, input buffer circuit 1320 may provide a logic low output at output terminal 1308.

Figure 14:
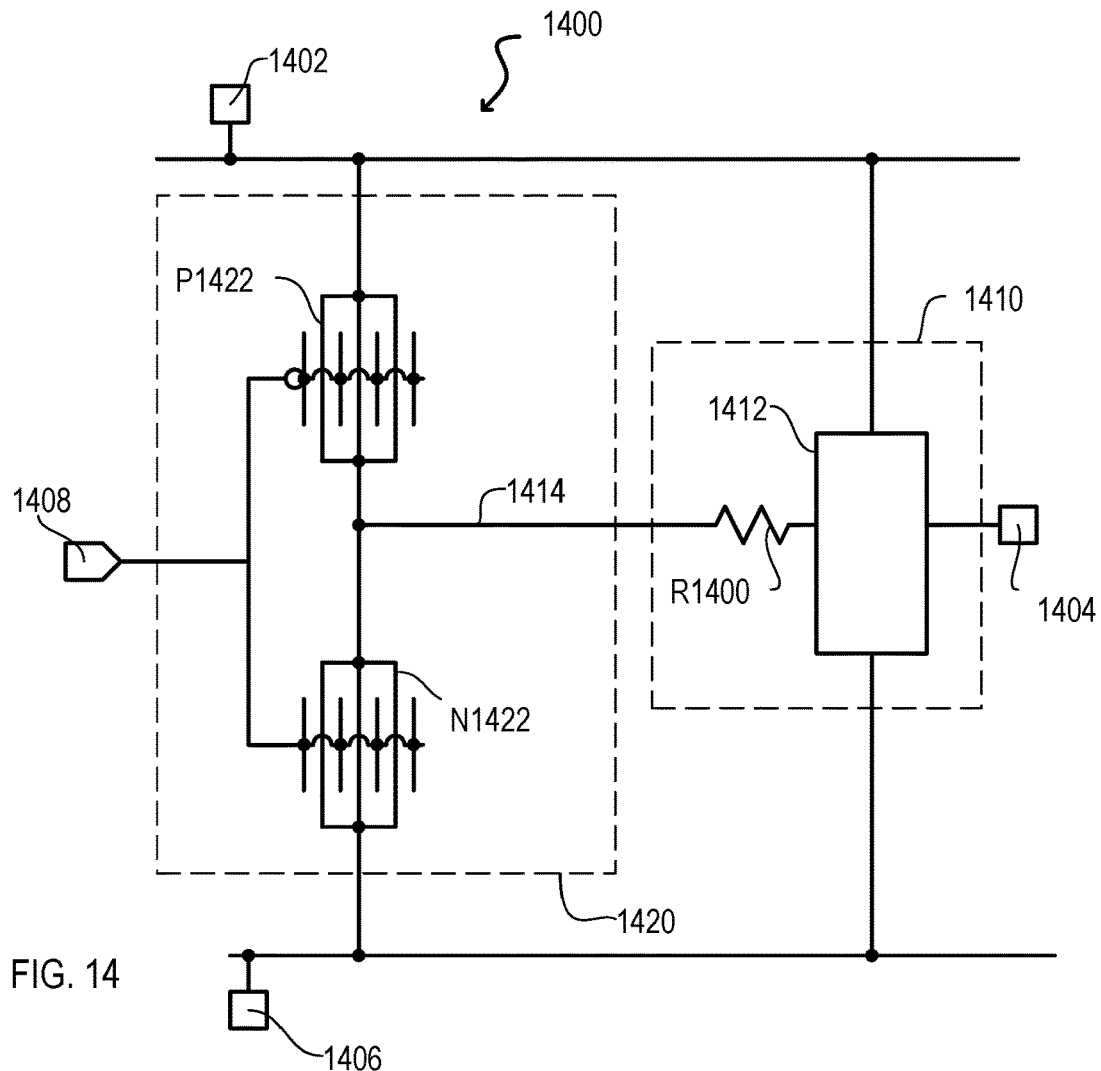
FIG. 14 is a circuit schematic diagram of an integrated circuit device according to an embodiment.

Referring now to FIG. 14, a circuit schematic diagram of an integrated circuit device according to an embodiment is set forth and given the general reference character 1400.

Integrated circuit device 1400 can include an ESD protection circuit structure 1410 and an output buffer circuit 1420. ESD circuit structure 1410 can be electrically connected to a pad 1404 where an output signal may be provided externally to the integrated circuit device 1400. The output signal may pass from output buffer 1420 through the ESD circuit structure 1410 to pad 1404.

Output buffer circuit 1420 may receive an input signal from terminal 1408 and may provide an output signal at terminal 1414

ESD circuit structure 1420 can include an ESD structure 1412 and a resistor R1400. ESD structure 1412 may be electrically connected to pads (1402, 1404, and 1406). Pad 1402 may receive an externally provided power supply potential, such as VDD. Pad 1406 receive an externally provided power supply potential, such as VSS. Pad 1404 may receive a signal to be provided externally from integrated circuit device 1400. ESD protection circuit structure 1412 may be electrically connected to a first terminal of resistor R1400. A second terminal of resistor R1400 may be electrically connected to terminal 1414.

ESD protection circuit structure 1412 may be an ESD protection circuit structure (900, 1000, or 1100), as just a few examples. In the case of ESD protection circuit structure (900, 1000, or 1100), pad 1404 may be electrically connected to terminal (910, 1010, or 1110), respectively.

Output buffer circuit 1420 may include IGFETs (P1422 and N1422). IGFET P1422 may have a source terminal electrically connected to pad 1402. IGFET P1422 may have a gate terminal and input terminal 1408 and a gate of IGFET N1422. IGFET P1422 may have a drain commonly connected to a drain of IGFET N1422 and a second terminal of resistor R1400 at node 1414. IGFET N1422 may have a source terminal electrically connected to pad 1406. Output buffer circuit 1420 may operate as an inverter logic circuit that provides current drive to a signal, such as a data signal or the like that is to be driven to components external to integrated circuit device 1400.

IGFETs (P1422 and N1422) may each include a control gate that may surround a plurality of horizontally disposed channel regions that can be vertically aligned above a substrate as set forth in FIGS. 3A, 3B, 4, 5, and 6 and may be formed in region (702 or 802) as set forth in FIGS. 7 and 8, respectively. ESD protection circuit structure 1412 may be formed in regions 402 in FIGS. 7 and 8, for example. Resistor R1400 may be formed in region (402 and/or 422) in FIGS. 7 and 8, for example. Resistor R1400 may even be formed in region (702 or 802) as set forth in FIGS. 7 and 8, respectively. Resistor R1300 may be formed, for example, as a diffusion layer in region 402, a metal layer in region 422, and/or a metal layer in region (702 or 802) as set forth in FIGS. 7 and 8, respectively.

Figure 15:
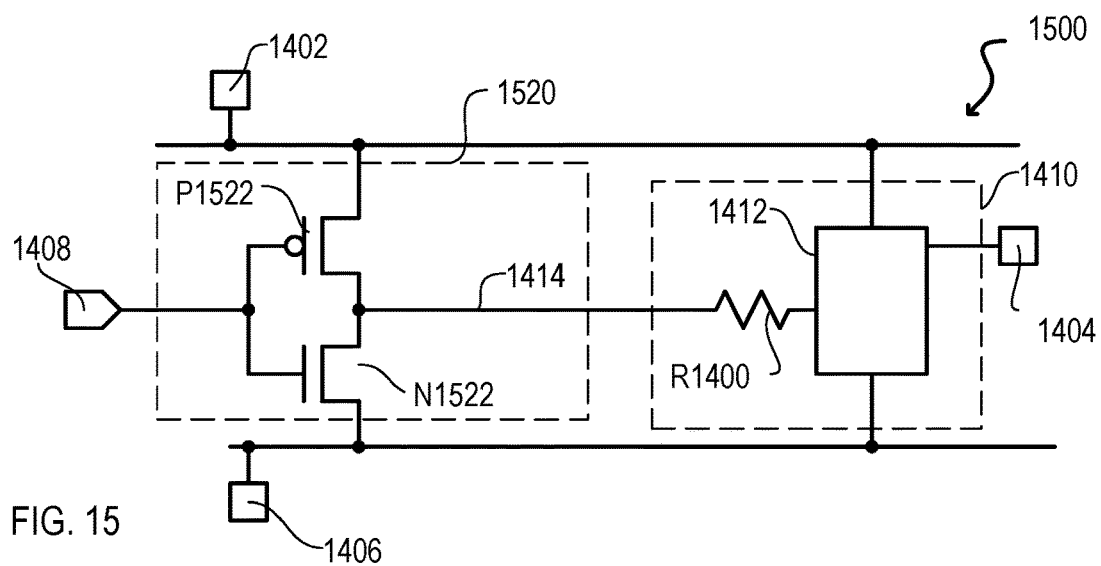
FIG. 15 is a circuit schematic diagram of an integrated circuit device according to an embodiment.

Referring now to FIG. 15, a circuit schematic diagram of an integrated circuit device according to an embodiment is set forth and given the general reference character 1500. Integrated circuit device 1500 may include like constituents as integrated circuit device 1400 and such constituents may be designated by the same reference character and for brevity will not be discussed. Integrated circuit device 1500 may differ from integrated circuit device 1400 of FIG. 14, in that an output buffer 1520 may have IGFETs (P1522 and N1522) that are formed in substrate 402 and may be planar IGFETs of FinFETs, while other circuits, such as an internal circuit (140 or 212) of FIGS. 1 and 2, respectively, may be formed from IGFETs that include a control gate that may surround a plurality of horizontally disposed channel regions that can be vertically aligned above a substrate as set forth in FIGS. 3A, 3B, 4, 5, and 6 and may be formed in region (702 or 802) as set forth in FIGS. 7 and 8, respectively.

Integrated circuit device 1300 and integrated circuit devices (1400 and 1500) may be incorporated into integrated circuit devices (100 and 200). Integrated circuit device 1300 may have a separate pad electrically connected to the input terminal 1304 than a pad electrically connected to the output terminal 1404 of integrated circuit devices (1400 and 1500). Input buffer circuit 1320 and ESD structure 1310 of integrated circuit device 1300 may be used as interface circuit 150 and ESD circuit structure 170 of integrated circuit device 100 of FIG. 1. Input buffer circuit 1320 and ESD structure 1310 of integrated circuit device 1300 may be used as interface circuit 254 and ESD circuit structure 256 of integrated circuit device 200 of FIG. 2. Output buffer circuit 1420 and ESD structure 1410 of integrated circuit device 1400 may be used as interface circuit 150 and ESD circuit structure 170 of integrated circuit device 100 of FIG. 1. Output buffer circuit 1420 and ESD structure 1410 of integrated circuit device 1400 may be used as interface circuit 254 and ESD circuit structure 256 of integrated circuit device 200 of FIG. 2. Output buffer circuit 1520 and ESD structure 1510 of integrated circuit device 1500 may be used as interface circuit 150 and ESD circuit structure 170 of integrated circuit device 100 of FIG. 1. Output buffer circuit 1520 and ESD structure 1510 of integrated circuit device 1500 may be used as interface circuit 254 and ESD circuit structure 256 of integrated circuit device 200 of FIG. 2.

Figure 16:
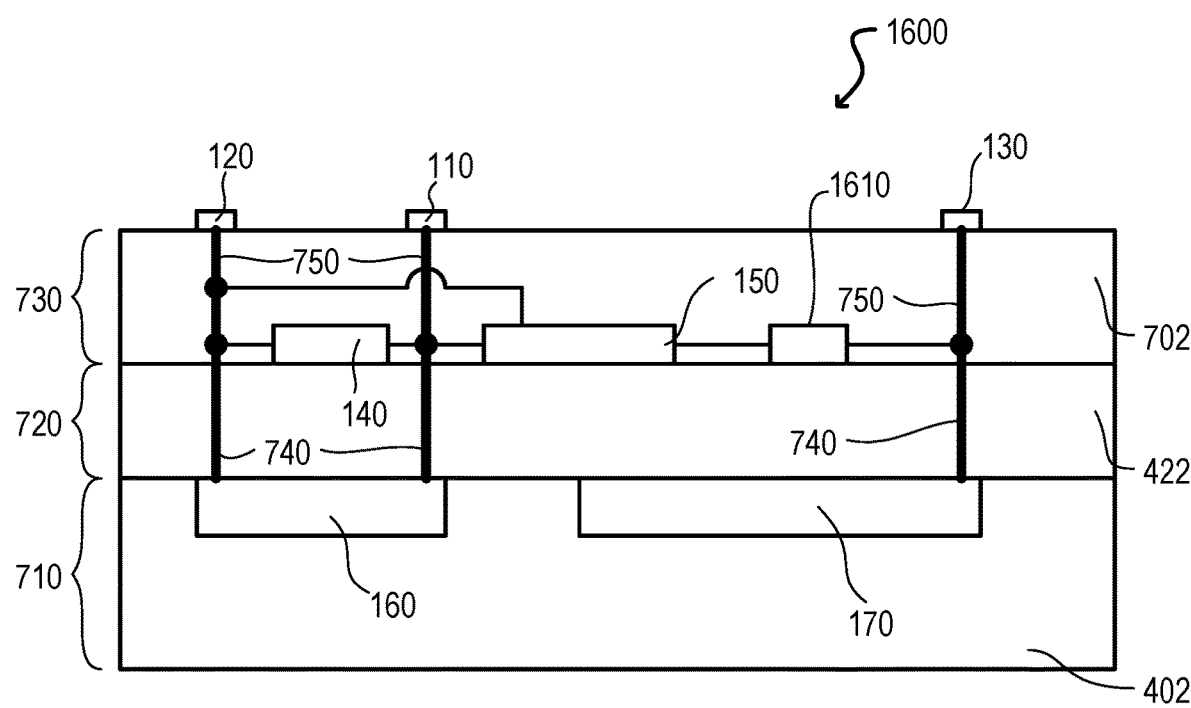
FIG. 16 is a circuit schematic diagram of an integrated circuit device according to an embodiment.

Referring now to FIG. 16, a schematic diagram of an integrated circuit device according to an embodiment is set forth and given the general reference character 1600.

Integrated circuit device 1600 may be like integrated circuit device 700 of FIG. 7, except integrated circuit device 1600 may include a resistor 1610 formed in region 730 along with the circuitry comprising p-type and n-type IGFETs having a plurality of horizontally disposed channels that can be vertically aligned above semiconductor substrate 402.

Resistor 1610 may have one terminal electrically connected to pad 130 as well as ESD protection circuit structure 170 and another terminal electrically connected to interface circuit 150. Resistor 1610 may correspond to resistors R1400 in integrated circuit devices (1400 and 1500) as set forth in FIGS. 14 and 15. Resistor 1610 may comprise a metal, such as copper, tungsten, aluminum, and/or titanium or even polysilicon, as just a few examples.

Figure 17:
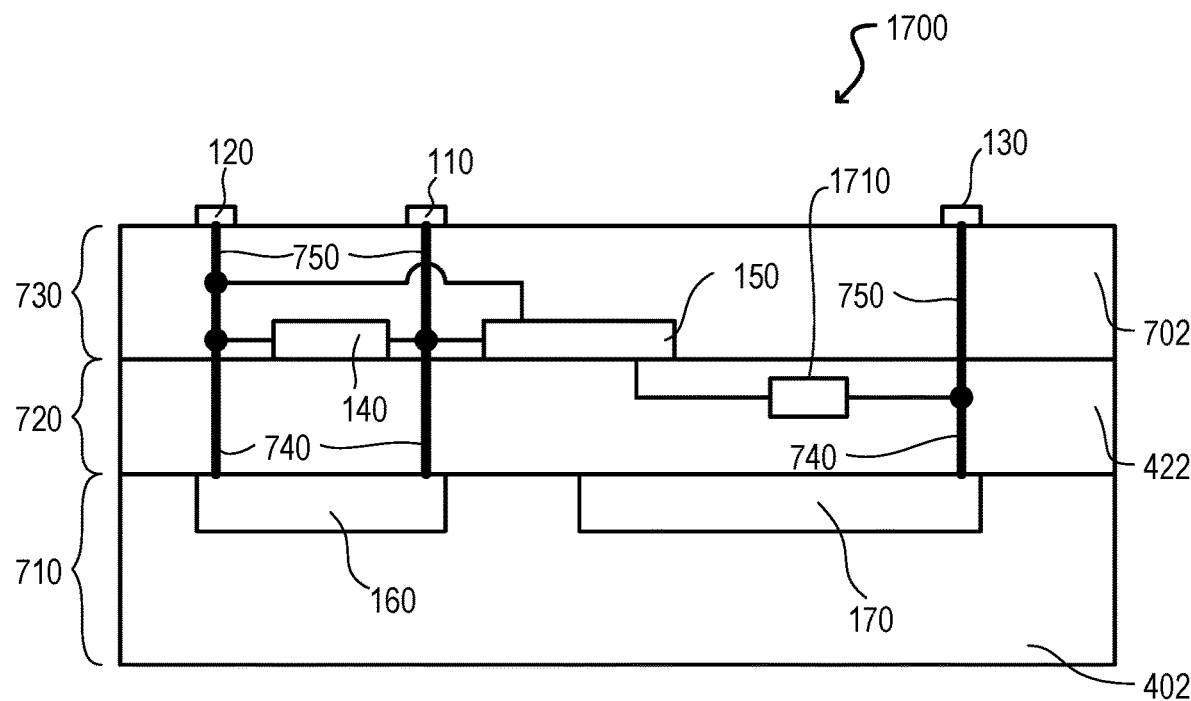
FIG. 17 is a schematic diagram of an integrated circuit device according to an embodiment.

Referring now to FIG. 17, a schematic diagram of an integrated circuit device according to an embodiment is set forth and given the general reference character 1700.

Integrated circuit device 1700 may be like integrated circuit device 700 of FIG. 7, except integrated circuit device 1700 may include a resistor 1710 formed in region 720 along with wirings 740.

Resistor 1710 may have one terminal electrically connected to pad 130 as well as ESD protection circuit structure 170 and another terminal electrically connected to interface circuit 150. Resistor 1710 may correspond to resistors R1400 in integrated circuit devices (1400 and 1500) as set forth in FIGS. 14 and 15. Resistor 1710 may comprise a metal, such as copper, tungsten, aluminum, and/or titanium or even polysilicon, as just a few examples.

Referring now to FIG. 18, a schematic diagram of an integrated circuit device according to an embodiment is set forth and given the general reference character 1800.

Integrated circuit device 1800 may be like integrated circuit device 700 of FIG. 7, except integrated circuit device 1800 may include a resistor 1810 formed in region 710 along with ESD structures (160 and 170) and planar IGFETs fabricated using older technologies with more relaxed critical dimensions.

Resistor 1810 may have one terminal electrically connected to pad 130 as well as ESD protection circuit structure 170 and another terminal electrically connected to interface circuit 150. Resistor 1810 may correspond to resistors R1400 in integrated circuit devices (1400 and 1500) as set forth in FIGS. 14 and 15. Resistor 1810 may comprise a metal, such as copper, tungsten, aluminum, and/or titanium, or polysilicon or a diffusion layer, as just a few examples.

Resistors (R1300, R1400, 1610, 1710, and/or 1810) need sufficient resistance to provide a voltage drop between the pad 1404 and the interface circuit 150. Resistors (R1300 and R1400) may be about 1 kΩ to 10 kΩ.

The process minimum feature size of region 730 may be the control gate length of p-type and n-type IGFETs having a plurality of horizontally disposed channels that can be vertically aligned above semiconductor substrate 402. Gate length is illustrated with reference to FIG. 6, in which "L" is the gate length of IGFET 410A/B. In the embodiments, the minimum gate length may be about 5 nm or less.

The process minimum feature size of region 402 may be substantially greater. For example, a gate length of planar IGFETs formed in region 402 may be 10 nm or greater. An example of a planar IGFET is illustrated in FIG. 19.

Referring now to FIGS. 19, a cross-sectional schematic diagram of a planar IGFET that can be formed in region 402 is set forth and given the general reference character 1900.

A planar IGFET formed in region 402 can include a semiconductor substrate 1902 in which source/drain regions 1918 may be formed, a gate insulating layer 1920, a control gate 1914 and an insulating layer 1930. Region 402 can include p-type IGFETs and n-type IGFETs. For example, an n-type IGFET may be formed by implanting n-type impurities into source/drain regions 1918 of a p-type semiconductor substrate 1902. A p-type IGFET may be formed by providing a n-type well in semiconductor substrate 1902 and implanting p-type impurities into source/drain regions 1918. Planar IGFET may have a gate length L1 of about 10 nm or greater. In this way, cost may be reduced as compared to the fabrication to IGFETs having a plurality of horizontally disposed channels that can be vertically aligned above a substrate with each channel being surrounded by a gate structure as in region 702.

The IGFET formed in region 402 can be used as IGFETs (P1522 and N1522) that are formed in substrate 402 as illustrated in FIG. 15, while other circuits, such as an internal circuit (140 or 212) of FIGS. 1 and 2, respectively, may be formed from IGFETs that include a control gate that may surround a plurality of horizontally disposed channel regions that can be vertically aligned above a substrate as set forth in FIGS. 3A, 3B, 4, 5, and 6 and may be formed in region (702 or 802) as set forth in FIGS. 7 and 8, respectively.

Referring now to FIGS. 20A and 20B, a cross-sectional schematic diagrams of a Fin field effect transistor (FinFET) type IGFET (i.e. FinFET) that can be formed in region 402 is set forth and given the general reference character 2000.

FIG. 20A may be a cross-sectional schematic diagram of a FinFET along the width of a channel region 2016 and FIG. 20B may be a cross-sectional schematic diagram of a FinFET along the length of a channel region 2016 and between source/drain regions 2018.

A FinFET formed in region 402 can include a semiconductor substrate 2002 in which source/drain regions 2018 may be formed, a gate insulating layer 2020, a control gate 2014 and an insulating layer 2030. Region 402 can include p-type FinFETs and n-type FinFETs. For example, an n-type FinFET may be formed by implanting n-type impurities into source/drain regions 2018 of a p-type semiconductor substrate 2002. A p-type FinFET may be formed by providing a n-type well in semiconductor substrate 2002 and implanting p-type impurities into source/drain regions 2018. FinFET may have a gate length L2 of about 7 nm or greater. In this way, cost may be reduced as compared to the fabrication to IGFETs having a plurality of horizontally disposed channels that can be vertically aligned above a substrate with each channel being surrounded by a gate structure as in region 702.

The FinFET formed in region 402 can be used as IGFETs (P1522 and N1522) that are formed in substrate 402 as illustrated in FIG. 15, while other circuits, such as an internal circuit (140 or 212) of FIGS. 1 and 2, respectively, may be formed from IGFETs that include a control gate that may surround a plurality of horizontally disposed channel regions that can be vertically aligned above a substrate as set forth in FIGS. 3A, 3B, 4, 5, and 6 and may be formed in region (702 or 802) as set forth in FIGS. 7 and 8, respectively.

Figure 21:
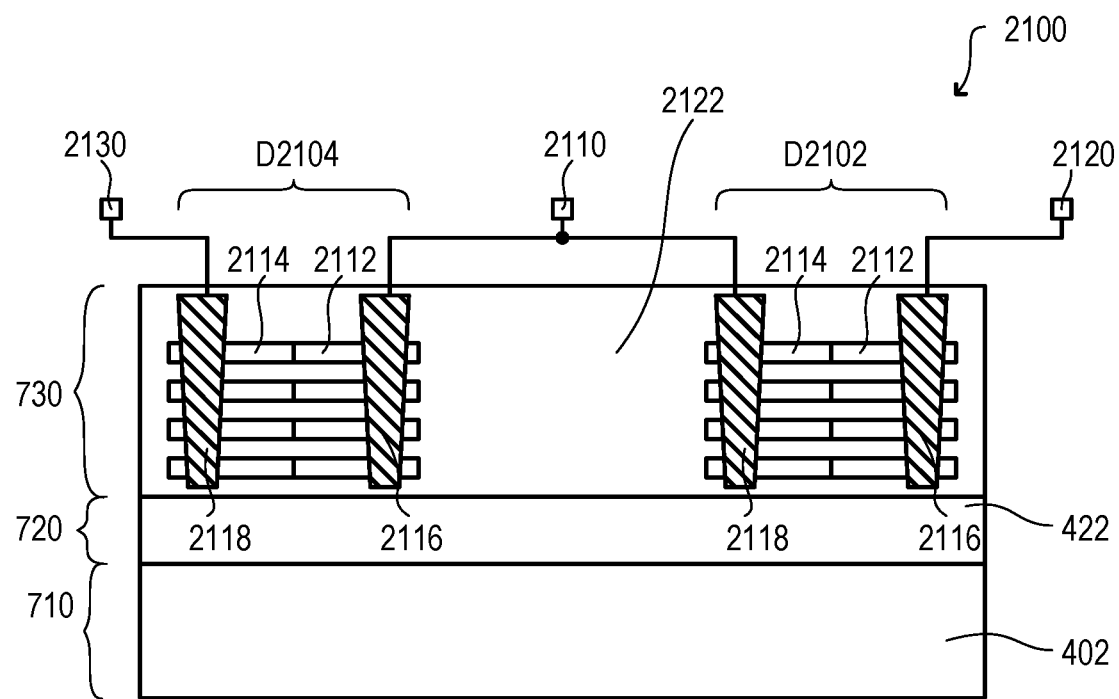
FIG. 21 is a schematic diagram of an integrated circuit device having an ESD protection circuit structure having a plurality of horizontally current carrying regions that can be vertically aligned above a substrate according to an embodiment.

Referring now to FIG. 21, a schematic diagram of an integrated circuit device having an ESD protection circuit structure having a plurality of horizontally current carrying regions that can be vertically aligned above a substrate is set forth and given the general reference character 2100.

Integrated circuit device includes regions (710, 720, and 730). As noted earlier, region 710 may be formed with a technology node that is older and cheaper than region 730. Region 710 may include planar IGFETs and ESD structures. However, integrated circuit device 2100 may differ in that an ESD structure may be formed in region 730 and may include diodes (D2102 and D2104). Diodes (D2102 and D2104) may include a plurality of horizontally disposed current carrying regions that can be vertically aligned above a substrate region 402. The current carrying regions may include a first impurity doped region 2112 and a second impurity doped region 2114. Each diode (D2102 and D2104) may include a cathode terminal 2116 and an anode terminal 2118. The anode terminal 2118 of diode D2102 may be electrically connected to the cathode terminal 2116 of diode D2104 and may be electrically connected to a pad 2110 which may be electrically connected to provide or receive an external signal. The cathode terminal 2116 of diode D2102 may be electrically connected to a pad 2120. Pad 2120 may receive an externally provided power supply potential, such as VDD. The anode terminal 2118 of diode D2104 may be electrically connected to a pad 2130. Pad 2130 may receive an externally provided power supply potential, such as VSS.

The ESD protection circuit structure of FIG. 21 including diodes (D2102 and D2104) may correspond to ESD protection circuit structure 1000 of FIG. 10 and may be used accordingly. Pad 2130 may correspond to terminal 1030, pad 2110 may correspond to terminal 1010, and pad 2120 may correspond to terminal 1020. Likewise, diode D2102 may correspond to diode D1002 and diode D2104 may correspond to diode D1004.

Diodes (D2102 and D2104) may be formed by forming a layered crystal of two materials over dielectric region 422. For example, layers of silicon and silicon germanium may be formed. The silicon layer may form the first and second impurity doped regions (2112 and 2114), i.e. the current carrying regions. After a vertical etch, the silicon germanium layers may be etched by using a chemical that can selectively etch silicon germanium with the cathode and anode terminals (2116 and 2118) used as support structures. Next, a dielectric layer 2122 (may be formed using atomic layer deposition of a dielectric, for example, silicon dioxide. The first impurity doped region 2112 may be doped with n-type carriers, such as phosphorous and/or arsenic, for example. The second impurity doped region 2114 may be doped with p-type carriers, such as boron, for example. The doping may be done by implantation with a mask layer over regions other than the desired regions to receive the impurities. In this way each of the plurality of horizontally disposed current carrying regions may form a p-n junction diode in parallel with each other.

Diodes (D2102 and D2104) may be formed in conjunction with insulated gate field effect transistors (IGFETs) having a plurality of horizontally disposed channels that can be vertically aligned above a substrate with each channel being surrounded by a gate structure as discussed above.

Figure 22:
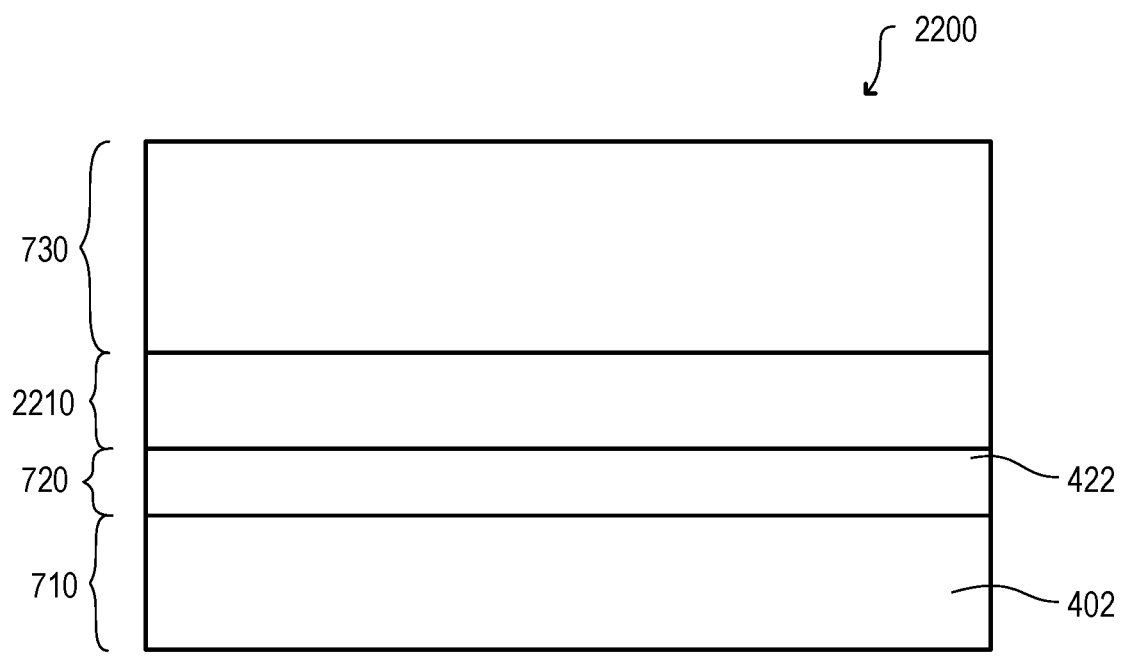
FIG. 22 is a diagram of an integrated circuit device according to an embodiment.

Referring now to FIG. 22, a diagram of an integrated circuit device according to an embodiment is set forth and given the general reference character 2100.

Integrated circuit device 2200 may differ from integrated circuit devices of previous embodiments in that a region 2210 may be disposed between regions (720 and 730), otherwise integrated circuit device 2200 may be substantially the same as previous embodiments. Region 2210 may be a crystalline semiconductor layer. For example, region 2210 may be silicon material. Region 2210 may be silicon, silicon carbide, epitaxial silicon, as just a few examples. Region 2210 may improve the manufacturability of layers used to form the horizontally disposed and vertically aligned channel regions. Integrated circuit device 2200 may include insulated gate field effect transistors (IGFETs) having a plurality of horizontally disposed channels that can be vertically aligned above a substrate with each channel being surrounded by a gate structure formed in region 730 as discussed above, as well as ESD protection circuit structures formed in regions (710, 720, and 730) as discussed in previous embodiments.

Figure 23:
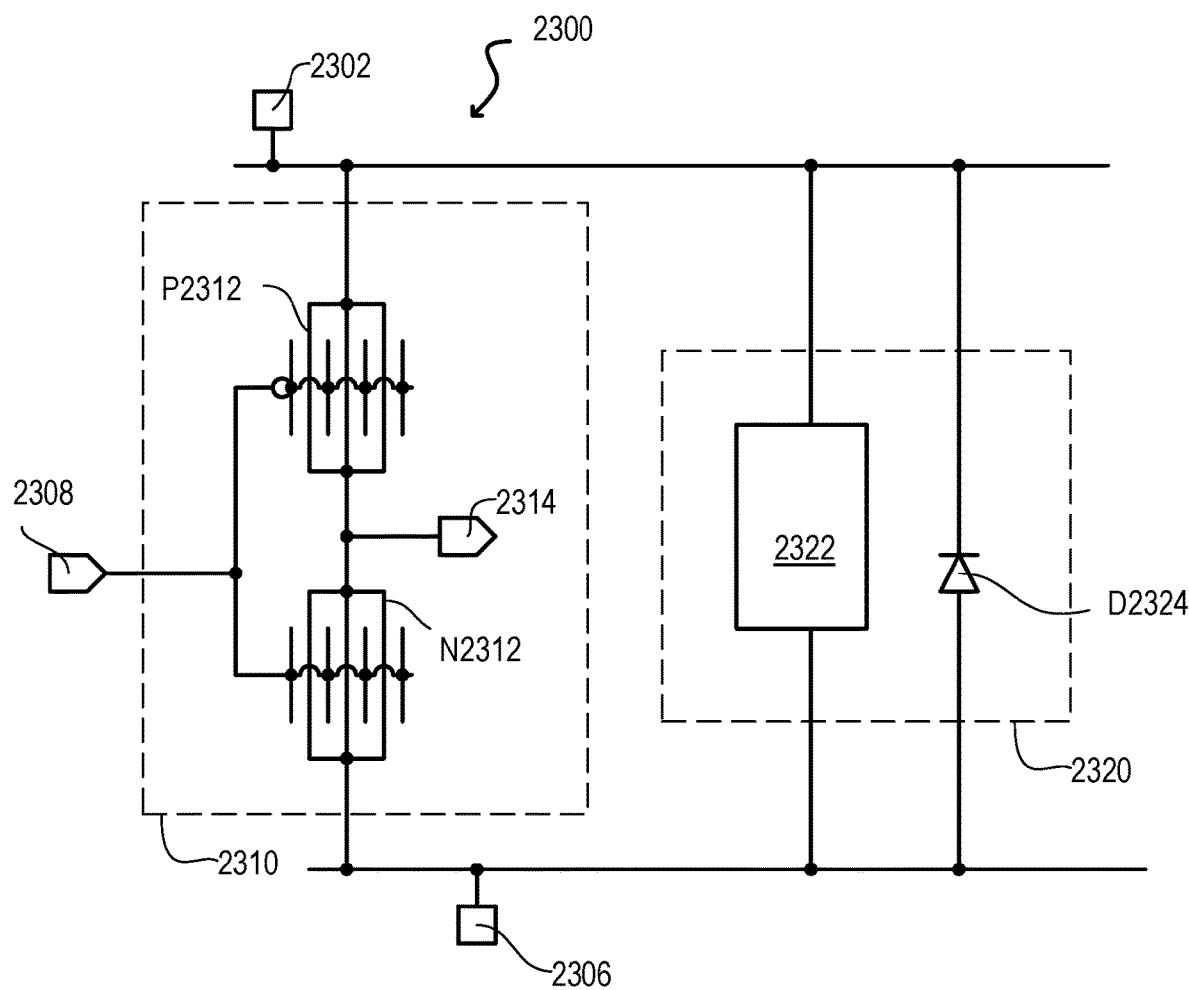
FIG. 23 is a circuit schematic diagram of an internal circuit and an ESD protection circuit structure according to an embodiment.

Referring now to FIG. 23, a circuit schematic diagram of an internal circuit and an ESD protection circuit structure according to an embodiment is set forth and given the general reference character 2300.

Circuit 2300 can include an internal circuit 2310 and an ESD protection circuit structure 2320.

Internal circuit 2300 may receive a power supply potential from a pad 2302. The power supply potential from pad 2302 may be an externally applied power supply potential such as VDD. Internal circuit 2300 may receive a power supply potential from a pad 2306. The power supply potential from pad 2306 may be an externally supplied power supply potential such as VSS. Internal circuit may receive an input signal from an input terminal 2308 and provide an output signal at a terminal 2314. Internal circuit 2310 may include a p-type IGFET P2312 and an n-type IGFET N2312. Both p-type IGFET P2312 and n-type IGFET N2312 may each include a plurality of horizontally disposed channels that can be vertically aligned above a substrate with each channel being surrounded by a gate structure.

P-type IGFET P2312 may have a source terminal electrically connected to pad 2302. N-type IGFET N2312 may have a source terminal electrically connected to pad 2306. P-type IGFET P2312 and N-type IGFET N2312 may have gate terminals commonly connected to receive the input signal from input terminal 2308 and drain terminals commonly connected to provide the output signal at output terminal 2314.

Internal circuit 2310 and may be used as internal circuit 140 and/or internal circuit 212 of FIGS. 1 and 2, respectively. ESD protection circuit structure 2320 may be used as ESD protection circuit structure 160 or any/each or ESD circuit structures (214 and 252) of FIGS. 1 and 2, respectively.

Internal circuit 2310 may not be electrically connected to receive or provide a signal external to the integrated circuit device.

ESD protection circuit structure 2320 may include two ESD protection circuits, a diode D2324 and an ESD protection circuit 2322, each electrically connected between pads (2302 and 2306). In this way, ESD protection circuit structure 2320 may provide protection for an ESD event at either pad (2302 or 2306), that receive externally provided power supply potentials. ESD protection circuit 2322 may be a SCR such as SCR 900 illustrated in FIG. 9. ESD protection circuit 2322 can be provided in regions (710 or 810), Diode D2324 can have a cathode terminal electrically connected to pad 2302 and an anode terminal electrically connected to pad 2306. Diode D2324 can be formed in regions (710 or 810) as a p-n junction or in region (730 or 830). When diode D2324 is formed in regions (730 or 830), diode D2324 may include a plurality of horizontally current carrying regions that can be vertically aligned above a substrate as illustrated with respect to diodes (D2104 and D2102) in FIG. 21.

Figure 24:
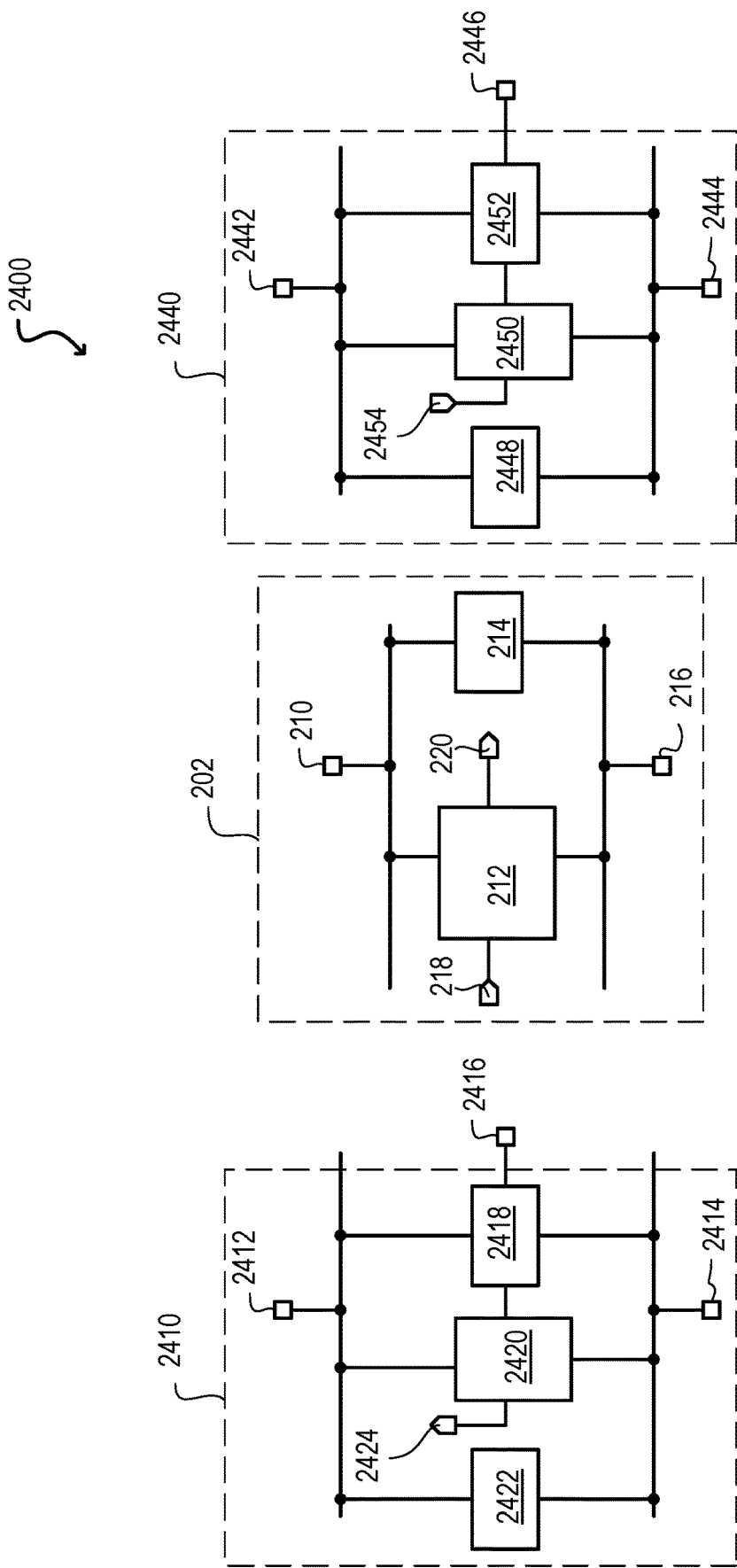
FIG. 24 is a circuit schematic diagram of an integrated circuit device including a circuit having an ESD protection circuit structure according to an embodiment.

Referring now to FIG. 24, an integrated circuit device including a circuit having an ESD protection circuit structure according to an embodiment is set forth in a circuit schematic diagram and given the general reference character 2400. Integrated circuit device 2400 may have similar circuit constituents as integrated circuit device 200 of FIG. 2 and such constituents may have the same reference character. Integrated circuit device 2400 may include a first circuit section 202, a second circuit section 2410, and a third circuit section 2440. First circuit section 202 may include circuits that only have external connections to a power supply potential and/or a ground (VSS) potential. Second circuit section 2410 may include circuits that have external connections to a power supply potential, a ground potential, and/or a pad coupled to receive an external signal, such as a data signal, control signal or a clock signal, as just a few examples. Third circuit section 2440 may include circuits that have external connections to a power supply potential, a ground potential, and/or a pad coupled to provide an external signal, such as a data signal, control signal or a clock signal, as just a few examples.

First circuit section 202 may include an internal circuit 212 and an ESD protection circuit structure 214. Internal circuit 212 and ESD structure 214 may each be electrically connected to pad (210 and 216). Internal circuit 212 may receive an input signal at an input terminal 218 and may provide an output signal at an output terminal 220. Pad 210 may receive an external power supply potential, such as VDD and pad 216 may receive an external reference potential such as VSS. In other embodiments, internal circuit 212 may be an internal power supply generator and may receive an external power supply potential at pad 210 and may provide an internal power supply potential to be used by internal circuits. The input terminal 218 and the output terminal 220 of internal circuit 212 are not electrically connected to any pad that can receive or provide a signal external to the integrated circuit device 200.

Second circuit section 2410 may include pads (2412, 2414, and 2416), an ESD protection circuit structure 2422, an input buffer circuit 2420, and ESD protection circuit structure 2418. Input buffer circuit 2420 may receive an external signal at pad 2416 through ESD protection circuit structure 2418 and may provide an internal signal at terminal 2424. Input buffer circuit 2420 may be electrically connected to pads (2412 and 2414). Pads (2412 and 2414) may respectively receive an external power supply potential (such as VDD) and a reference potential (such as VSS). ESD structure 2422 may be electrically connected between pads (2412 and 2414). ESD structure 2418 may be electrically connected to pads (2412, 2414, and 2416).

Third circuit section 2440 may include pads (2442, 2444, and 2446), an ESD protection circuit structure 2448, an output buffer circuit 2450, and ESD protection circuit structure 2452. Output buffer circuit 2450 may receive an internal signal at terminal 2454 and may provide an external signal at pad 2446 through ESD protection circuit structure 2452. Output buffer circuit 2450 may be electrically connected to pads (2442 and 2444). Pads (2442 and 2444) may respectively receive an external power supply potential (such as VDD) and a reference potential (such as VSS). ESD structure 2448 may be electrically connected between pads (2442 and 2444). ESD structure 2452 may be electrically connected to pads (2442, 2444, and 2446).

In one embodiment, internal circuit 212 may include insulated gate field effect transistors (IGFETs) having a plurality of horizontally disposed channels that can be vertically aligned above a substrate with each channel being surrounded by a gate structure. Input buffer circuit 2420 may include insulated gate field effect transistors (IGFETs) having a plurality of horizontally disposed channels that can be vertically aligned above a substrate with each channel being surrounded by a gate structure. Output buffer circuit 2452 may include insulated gate field effect transistors (IGFETs) having a plurality of horizontally disposed channels that can be vertically aligned above a substrate with each channel being surrounded by a gate structure. Internal circuit 212, input buffer circuit 2420, and output buffer circuit 2450 may include p-type and n-type IGFETs. In one embodiment, ESD protection circuit structures (214, 2418, 2422, 2448, and 2452) may include electrical components (such as diodes, transistors, and/or resistors) formed with a plurality of horizontally disposed cathodes and anodes that can be vertically aligned above a substrate. In one embodiment, ESD protection circuit structures (214, 2418, 2422, 2448, and 2452) may include electrical components (such as diodes, transistors, SCRs and/or resistors) formed in the substrate. In one embodiment input buffer circuit 2420 and/or output buffer circuit 2452 may include electrical components (such as IGFETs) formed in the substrate.

When ESD protection circuit structures (214, 2418, 2422, 2448, and 2452) are formed in a semiconductor substrate of integrated circuit device 2400, a process having larger critical dimensions (i.e. an older and cheaper process) may be used. The semiconductor substrate may then be sent to a state of the art fabrication facility to form the circuit including insulated gate field effect transistors (IGFETs) having a plurality of horizontally disposed channels that can be vertically aligned above a substrate with each channel being surrounded by a gate structure as will be discussed further in the instant specification.

Integrated circuit device 1300 and integrated circuit devices (1400 and 1500) may be incorporated into integrated circuit device 2400. Input buffer circuit 1320 and ESD structure 1310 of integrated circuit device 1300 may be used as input circuit 2420 and ESD circuit structure 2418 of integrated circuit device 2400 of FIG. 24. Output buffer circuit 1420 and ESD structure 1410 of integrated circuit device 1400 may be used as output buffer circuit 2450 and ESD circuit structure 2452 of integrated circuit device 2400 of FIG. 24. Output buffer circuit 1520 and ESD structure 1510 of integrated circuit device 1500 may be used as output buffer circuit 2450 and ESD circuit structure 2452 of integrated circuit device 2400 of FIG. 24.

Power supply potentials externally provided to pads (210, 2412, and 2442) may be different power supply potentials, such as a first potential (VDD1) for internal circuit 212, a second potential (VDD2) for input buffer circuit 2420, and/or a third potential (VDD3) for output buffer circuit 2450.

Input buffer 1300 of FIG. 13 and output buffers (1400 and 1500) of FIGS. 14 and 15 may be incorporated into integrated circuit devices 2400.

Integrated circuit devices (700, 800, 1600, 1700, 1800, 2100, and 2200) may be contiguous structures, such that, regions may be deposited or bonded in a semiconductor fabrication facility and preferably all formed on a contiguous wafer in a multiple of units and then separated before packaged or set in a multi-chip package. For example, regions (710, 720, and 730) may be contiguous regions with virtually no separation other than a region border formed by a change of materials. Bonding of regions may be performed using wafer to wafer bonding, for example region 710 may be formed on a first semiconductor wafer and regions (720 and 730) may be formed on a second semiconductor wafer, then the first and second wafer may be bonded using a wafer to wafer bonding technique followed by dicing and packaging to form the integrated circuit device. Alternatively, region 710 may be formed on a first semiconductor wafer and regions (720 and 730) may be formed on a second semiconductor wafer, then the either the first or second wafer may be diced and a die pick and place may be used to place dies on the first or second intact wafer, followed by dicing and packaging to form the integrated circuit device.

It is understood that the term pad may be any circuit connection that is electrically connected to provide or receive a signal or a potential externally to the integrated circuit device. Such a connection can be a conduit for an ESD event.

Electrically connected can be a connection through a wiring other passive component such as a resistor.

A voltage may be expressed as a potential.

A signal can be a data or control signal that can transition between logic levels, as just a few examples. A signal is not a power supply potential used to provide power to circuitry.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An integrated circuit device, comprising:
   a first region;
   a second region formed over the first region;
   an internal circuit coupled between a first power supply potential and a second power supply potential, the internal circuit comprising an input terminal coupled to receive an input signal and an output terminal coupled to provide an output signal, the internal circuit comprising a first insulated gate field effect transistor (IGFET) formed in the second region, the first IGFET comprising a plurality of channels that extend in a first direction and are substantially aligned in a second direction to that crosses the first direction, and a control gate that substantially surrounds the plurality of channels, wherein the plurality of channels provide a controllable impedance path between a first source/drain terminal and a second source/drain terminal; and
   a first electrostatic discharge (ESD) protection circuit structure that is provided in the first region, and is electrically connected between the first power supply potential and the second power supply potential,
   wherein the control gate is coupled to receive the input signal and the first source/drain terminal is coupled to provide the output signal, and the internal circuit is not connected to receive a signal generated external to the integrated circuit device and is not connected to provide a signal external to the integrated circuit device.

2. The integrated circuit device of claim 1, wherein:
the first ESD protection circuit structure comprises a diode.

3. The integrated circuit device of claim 2, wherein:
the diode comprises an anode terminal electrically connected to the first power supply potential and a cathode region electrically connected to the second power supply potential.

4. The integrated circuit device of claim 1, wherein:
the first ESD protection circuit structure comprises a silicon controlled rectifier (SCR) circuit coupled between the first power supply potential and the second power supply potential.

5. The integrated circuit device of claim 1, wherein:
the internal circuit further comprises a second IGFET formed in the second region, the second IGFET comprising a plurality of channels that extend in the first direction and are substantially aligned in the second direction, and a control gate that substantially surrounds the plurality of channels, wherein the plurality of channels provide a controllable impedance path between a third source/drain terminal and a fourth source/drain terminal, and the third source/drain terminal is coupled to the first source/drain terminal; and
the first IGFET is a p-type IGFET and the second IGFET is a n-type IGFET.

6. The integrated circuit device of claim 5, wherein:
the p-type IGFET and n-type IGFET are configured as an inverter circuit.

7. The integrated circuit device of claim 1, wherein:
the first and second power supply potentials are provided from a source that is external to the integrated circuit device.

8. The integrated circuit device of claim 1, further comprising:
an input buffer circuit coupled to receive an input signal provided from a source that is external to the integrated circuit device, the input signal received at a first pad.

9. The integrated circuit device of claim 8, further comprising:
a second ESD protection circuit structure having a first terminal electrically connected between the first pad and an input terminal of the input buffer circuit.

10. The integrated circuit device of claim 9, wherein:
the second ESD protection circuit structure comprises a resistor electrically connected between the first terminal of the second ESD protection circuit structure and the input terminal of the input buffer circuit.

11. The integrated circuit device of claim 10, wherein:
the second ESD protection circuit structure further comprises a first diode having an anode terminal coupled to the first terminal of the second ESD protection circuit structure.

12. The integrated circuit device of claim 11, wherein:
the second ESD protection circuit structure further comprises a second diode having a cathode terminal coupled to the first terminal of the second ESD protection circuit structure.

13. The integrated circuit device of claim 11, wherein:
the first diode comprises a plurality of current carrying regions disposed substantially in the first direction.

14. The integrated circuit device of claim 1, further comprising:
an output buffer circuit coupled to receive an input signal and provide an output signal externally to the integrated circuit device through a first pad.

15. The integrated circuit device of claim 14, further comprising:
a second ESD protection circuit structure having a first terminal electrically connected between the first pad and an output terminal of the output buffer circuit.

16. The integrated circuit device of claim 15, wherein:
the second ESD protection circuit structure further comprises a first diode having an anode terminal coupled to the first terminal of the second ESD protection circuit structure.

17. The integrated circuit device of claim 16, wherein:
the second ESD protection circuit structure further comprises a second diode having a cathode terminal coupled to the first terminal of the second ESD protection circuit structure.

18. The integrated circuit device of claim 16, wherein:
the first diode comprises a plurality of current carrying regions disposed substantially in the first direction.

19. The integrated circuit device of claim 1, wherein:
the first ESD protection circuit structure is provided in a semiconductor substrate.

20. An integrated circuit device, comprising:
a first region;
a second region over the first region;
an internal circuit coupled between a first power supply potential and a second power supply potential, the internal circuit comprising an input terminal configured to receive an input signal, an output terminal configured to provide an output signal, and a first insulated gate field effect transistor (IGFET),
wherein the first IGFET is provided in the second region, comprises a plurality of channels and a control gate configured to receive the input signal, and is configured to provide a controllable impedance path between a first source/drain terminal and a second source/drain terminal; and
a first electrostatic discharge (ESD) protection circuit structure that is provided in the first region, and is electrically connected between the first power supply potential and the second power supply potential.

* * * * *